US009490839B2

(12) United States Patent
Karczewicz et al.

(10) Patent No.: US 9,490,839 B2
(45) Date of Patent: Nov. 8, 2016

(54) VARIABLE LENGTH CODING OF VIDEO BLOCK COEFFICIENTS

(75) Inventors: Marta Karczewicz, San Diego, CA (US); Xianglin Wang, San Diego, CA (US); Wei-Jung Chien, San Diego, CA (US); Liwei Guo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1137 days.

(21) Appl. No.: 13/338,891

(22) Filed: Dec. 28, 2011

(65) Prior Publication Data

US 2012/0170662 A1    Jul. 5, 2012

Related U.S. Application Data

(60) Provisional application No. 61/429,415, filed on Jan. 3, 2011, provisional application No. 61/449,650, filed on Mar. 5, 2011, provisional application No. 61/505,514, filed on Jul. 7, 2011.

(51) Int. Cl.
*H04N 11/04* (2006.01)
*H03M 7/42* (2006.01)
*H04N 19/13* (2014.01)
(Continued)

(52) U.S. Cl.
CPC ............... *H03M 7/42* (2013.01); *H04N 19/13* (2014.11); *H04N 19/60* (2014.11); *H04N 19/93* (2014.11)

(58) Field of Classification Search
None
See application file for complete search history.

(56) References Cited

U.S. PATENT DOCUMENTS 5,227,878 A    7/1993  Puri et al.
5,253,055 A   10/1993  Civanlar et al.
5,600,812 A    2/1997  Park (Continued)

FOREIGN PATENT DOCUMENTS

CN    1280421 A    1/2001
EP    1424856 A1   6/2004
(Continued)

OTHER PUBLICATIONS

Ugur (Nokia) K et al: "Video coding technology proposal by Tandberg, Nokia, and Ericsson", 1. JCT-VC Meeting; Apr. 15, 2010-Apr. 23, 2010; Dresden; (Jointcollaborative Team on Video Coding of ISO/IEC JTC1/SC29/WG11 and ITU-TSG.16 ); URL: http://wftp3.1tu.int/av- arch/jctvc-site/, No. XP030007562, Apr. 24, 2010 (Apr. 24, 2010), XP030007563, ISSN: 0000-0049.*

(Continued)

*Primary Examiner* — James M Anderson, II
(74) *Attorney, Agent, or Firm* — Shumaker & Sieffert, P.A.

(57) ABSTRACT

This disclosure describes techniques for coding transform coefficients for a block of video data. According to some aspects of this disclosure, a coder (e.g., an encoder or decoder) may map between a code number cn and level_ID and run values associated with a first transform coefficient of the block of video data according to a first technique (e.g., a structured mapping), and map between a code number cn and level_ID and run values associated with a second coefficient of the block using a second technique. According to other aspects of this disclosure, the coder may map between a code number cn and level_ID and run syntax elements using different mathematical relationships, depending on a determined value of the code number cn or the level_ID syntax element. For example, the coder may access a mapping table of a plurality of mapping tables differently, dependent on the determined value.

27 Claims, 12 Drawing Sheets

(51) Int. Cl.
*H04N 19/60* (2014.01)
*H04N 19/93* (2014.01)

(56) References Cited

U.S. PATENT DOCUMENTS

| | | |
|---|---|---|
| 5,701,164 A | 12/1997 | Kato |
| 5,821,887 A | 10/1998 | Zhu |
| 5,999,111 A | 12/1999 | Park et al. |
| 6,014,095 A | 1/2000 | Yokoyama |
| 6,219,457 B1 | 4/2001 | Potu |
| 6,243,421 B1 | 6/2001 | Nakajima et al. |
| 6,646,578 B1 | 11/2003 | Au |
| 6,696,993 B2 | 2/2004 | Karczewicz |
| 6,771,193 B2 | 8/2004 | Craft |
| 6,795,584 B2 | 9/2004 | Karczewicz et al. |
| 7,394,942 B2 | 7/2008 | Chen et al. |
| 7,680,349 B2 | 3/2010 | Chen et al. |
| 7,702,013 B2 | 4/2010 | Schwarz et al. |
| 7,800,520 B2 | 9/2010 | Lin et al. |
| 7,843,998 B2 | 11/2010 | Bjontegaard |
| 7,920,629 B2 | 4/2011 | Bjontegaard et al. |
| 8,350,735 B2 | 1/2013 | Hallapuro et al. |
| 8,401,082 B2 | 3/2013 | Ye et al. |
| 8,446,301 B2 | 5/2013 | He et al. |
| 8,502,709 B2 | 8/2013 | Jia |
| 2003/0081850 A1 | 5/2003 | Karczewicz et al. |
| 2004/0021592 A1 | 2/2004 | Karczewicz |
| 2004/0233076 A1 | 11/2004 | Zhou |
| 2004/0234144 A1 | 11/2004 | Sugimoto et al. |
| 2006/0146936 A1 | 7/2006 | Srinivasan |
| 2007/0036223 A1 | 2/2007 | Srinivasan |
| 2007/0064937 A1 | 3/2007 | Van Leest et al. |
| 2007/0139236 A1 | 6/2007 | Shastry et al. |
| 2007/0200737 A1 | 8/2007 | Gao et al. |
| 2007/0274392 A1* | 11/2007 | Tseng ............... H04N 19/91 375/240.23 |
| 2008/0002767 A1 | 1/2008 | Schwarz et al. |
| 2008/0013633 A1 | 1/2008 | Ye et al. |
| 2008/0063083 A1 | 3/2008 | Kondo et al. |
| 2008/0089422 A1 | 4/2008 | Karczewicz |
| 2008/0089424 A1 | 4/2008 | Karczewicz et al. |
| 2008/0130507 A1 | 6/2008 | Kwon |
| 2008/0130512 A1 | 6/2008 | Park et al. |
| 2008/0165036 A1 | 7/2008 | Shima |
| 2008/0165858 A1 | 7/2008 | Karczewicz et al. |
| 2008/0209180 A1 | 8/2008 | Lee |
| 2008/0253443 A1 | 10/2008 | Mittal et al. |
| 2008/0310504 A1 | 12/2008 | Ye et al. |
| 2008/0310745 A1 | 12/2008 | Ye et al. |
| 2009/0016440 A1 | 1/2009 | Tian et al. |
| 2009/0086815 A1 | 4/2009 | Tian et al. |
| 2009/0110070 A1 | 4/2009 | Takahashi et al. |
| 2009/0154820 A1 | 6/2009 | Li et al. |
| 2009/0161974 A1 | 6/2009 | Bjontegaard et al. |
| 2009/0226103 A1 | 9/2009 | Choi et al. |
| 2009/0228601 A1 | 9/2009 | Tseng et al. |
| 2009/0232204 A1 | 9/2009 | Lee et al. |
| 2010/0020867 A1 | 1/2010 | Wiegand et al. |
| 2010/0046626 A1 | 2/2010 | Tu et al. |
| 2010/0135384 A1 | 6/2010 | Berkvens et al. |
| 2010/0150226 A1 | 6/2010 | Hallapuro et al. |
| 2010/0290533 A1 | 11/2010 | Minagawa |
| 2011/0169670 A1 | 7/2011 | Gou et al. |
| 2011/0182361 A1 | 7/2011 | Nakamura et al. |
| 2011/0206135 A1 | 8/2011 | Drugeon et al. |
| 2011/0211636 A1 | 9/2011 | Yamada et al. |
| 2011/0280314 A1 | 11/2011 | Sankaran et al. |
| 2012/0020408 A1 | 1/2012 | Chen et al. |
| 2012/0082230 A1 | 4/2012 | Karczewicz et al. |
| 2012/0163471 A1 | 6/2012 | Karczewicz et al. |
| 2012/0224628 A1 | 9/2012 | Seo et al. |
| 2012/0236931 A1 | 9/2012 | Karczewicz et al. |
| 2013/0010860 A1 | 1/2013 | Tian et al. |
| 2013/0089138 A1 | 4/2013 | Guo et al. |
| 2013/0114669 A1 | 5/2013 | Karczewicz et al. |
| 2013/0114734 A1 | 5/2013 | Karczewicz et al. |

FOREIGN PATENT DOCUMENTS

| | | |
|---|---|---|
| EP | 1553779 A1 | 7/2005 |
| EP | 1679903 A2 | 7/2006 |
| EP | 2182732 A1 | 5/2010 |
| JP | 2000134495 A | 5/2000 |
| JP | 2008048098 A | 2/2008 |
| TW | 201028010 A | 7/2010 |
| WO | 9517073 A1 | 6/1995 |
| WO | 9800807 A1 | 1/1998 |
| WO | 9836574 A1 | 8/1998 |
| WO | WO03027940 A1 | 4/2003 |
| WO | WO03063501 A1 | 7/2003 |
| WO | WO03084076 A1 | 10/2003 |
| WO | 2007063472 A2 | 6/2007 |
| WO | 2010022023 A1 | 2/2010 |

OTHER PUBLICATIONS

Ugur (Nokia) K et al: "Appendix to Description of video coding technology proposal by Tandberg, Nokia, and Ericsson", 1. JCT-VC Meeting; Apr. 15, 2010-Apr. 23, 2010; Dresden; (JointCollaborative Team on Video Coding of ISO/IEC JTC1/SC29/WG11 and ITU-TSG.16 ), Apr. 15-23, 2010.*

ITU-T H.265, Series H: Audiovisual and Multimedia Systems, Infrastructure of audiovisual services—Coding of moving video, High efficiency video coding, The International Telecommunication Union, Apr. 2013, 317 pages.

Karczewicz, et al., "Video Coding Technology Proposal by Qualcomm Inc.", Joint Collaborative Team on Video Coding (JCT-VC) No. JCTVC-A121, Apr. 15-23, 2010, 24 pp.

Karczewicz M et al., "Improvements on VLC", Joint Collaborative Team on Video Coding (JCT-VC) No. JCTVC-C263, Oct. 1-15, 2010, 5 pp.

Schwarz, Heiko et al., "Overview of the Scalable Video Coding Extension of the H.264/AVC Standard", IEEE Transactions on Circuits and Systems for Video Technology, vol. 17, No. 9, Sep. 2007, pp. 1103-1120.

Ugur K et al., "Appendix to Description of video coding technology proposal by Tandberg, Nokia, Ericsson", Joint Collaborative Team on Video Coding (JCT-VC) No. JCTVC-A119 Appendix, Apr. 15, 2010, pp. 1-55.

Ugur K et al., "Description of video coding technology proposal by Tandberg, Nokia, Ericsson", Joint Collaborative Team on Video Coding (JCT-VC) No. JCTVC-A119, Apr. 15, 2010, pp. 1-33.

U.S. Appl. No. 13/218,206, by Marta Karczewicz, filed Aug. 25, 2011.

Wiegand et al., "WD1: Working Draft 1 of High-Efficiency Video Coding", JCTVC-C403, 3rd Meeting: Guangzhou, CN, Oct. 7-15, 2010, 137 pp.

Wiegand et al., "WD2: Working Draft 2 of High-Efficiency Video Coding," JCTVC-D503, 4th Meeting: Daegu, KR, Jan. 20-28, 2011, 153 pp.

Wiegand et al., "WD3: Working Draft 3 of High-Efficiency Video Coding," Document JCTVC-E603, 5th Meeting: Geneva, CH, Mar. 16-23, 2011,193 pp.

Bross et al., "WD4: Working Draft 4 of High-Efficiency Video Coding," 6th Meeting: JCTVC-F803_d2, Torino, IT, Jul. 14-22, 2011, 226 pp.

Chen et al., "Comments on Generalized P and B Pictures," Document JCTVC-D401, 4th Meeting: Daegu, KR, Jan. 20-28, 2011, 4 pp.

ITU-T H.264, Series H: Audiovisual and Multimedia Systems, Infrastructure of audiovisual services—Coding of moving video, Advanced video coding for generic audiovisual services, The International Telecommunication Union. Jun. 2011, 674 pp.

Karczewicz et al., "CE5: coefficient coding with LCEC for large block," Document JCTVC-E383, 5th Meeting: Geneva, CH, Mar. 16-23, 2011, 3 pp.

(56) References Cited

OTHER PUBLICATIONS

Karczewicz et al., "CE5: Improved coefficient coding with LCEC," Document JCTVC-D374, WG11 No. m19150, 4th Meeting: Daegu, KR, Jan. 20-28, 2011, 2 pp.

Karczewicz et al., "Video coding technology proposal by Qualcomm Inc.," Document JCTVC-A121, 1st Meeting: Dresden, DE, Apr. 15-23, 2010, 25 pp.

Kim et al., "Memory-Efficient H.264/AVC CAVLC for Fast Decoding," IEEE Transactions on Consumer Electronics, vol. 52, No. 3, Aug. 2006, pp. 943-952.

Lin et al., "An Efficient Table-Merging Method for Variable Length Coding," 2007 IEEE International Conference on Electron Devices and Solid-State Circuits-EDSSC '07, 2007, IEEE Piscataway, NJ, USA, pp. 1179-1182.

Ugur et al., "Description of video coding technology proposal by Tandberg, Nokia, Ericsson," Document JCTVC-A119, 1st Meeting: Dresden, DE, Apr. 15-23, 2010, 33 pp.

Bross et al., "WD5: Working Draft 5 of High-Efficiency Video Coding," 7th Meeting: Geneva, Switzerland, Nov. 21-30, 2011, JCTVC-G1103_d2, 214 pp.

Second Written Opinion of international application No. PCT/US2011/067893, dated Dec. 21, 2012, 6 pp.

International Preliminary Report on Patentability from international application No. PCT/US2011/067893, dated Mar. 20, 2013, 8 pp.

Bross, B. et al., "High efficiency video coding (HEVC) text specification draft 6" Joint Collaborative Team on Video Coding, Document: JCTVC-H1003, Nov. 21-30, 2011, 259 pp.

Feng, Y. et al., "Low-Complexity Tools in AVS Part 7," Kluwer Academic Publishers, Journal of Computer Science and Technology, vol. 21, No. 3, May 1, 2006 9 pp.

International Search Report and Written Opinion of international application No. PCT/US2011/067893, dated Mar. 26, 2012, 15 pp.

Anonymous, "Advanced video coding for generic audiovisual services," International Telecommunication Union-Telecommunication Standardization Sector, H.264, Mar. 2010, 669 pp.

Ugur, K. et al., "High Performance, Low Complexity Video Coding and the Emerging HEVC Standard," IEEE Transactions on Circuits and Systems for Video Technology, vol. 20, No. 12, Dec. 2010, 10 pp.

Lee, S. et al., "Efficient coefficient coding method for large transform in VLC mode," Joint Collaborative Team on Video Coding, Document: JCTVC-C210, Oct. 7-15, 2010 6 pp.

Wang, Q. et al., "Context-Based 2D-VLC Entropy Coder in AVS Video Coding Standard," Kluwer Academic Publishers, Journal of Computer Science and Technology, vol. 21, No. 3, May 1, 2006, 8 pp.

"Test Model under Consideration," Joint Collaborative Team on Video Coding (JCT-VC) of ITU-T SG16 WP3 and ISO/IEC JTC1/SC29/WG11, Document: JCTVC-B205, Status: Output Document (draft000), Jul. 21-28, 2010, 152 pp.

Bjontegaard et al., "Context-Adaptive VLC (CVLC) Coding of Coefficients (JVT-O028)", Joint Video Team (JUT) of ISO/IEC MPEG & ITU-T VCEG (ISO/IEC JTC1/SC29/WG11 and ITU-T SG16 Q6), May 6, 2002, pp. 1-8, XP002257292.

ITU-T H.265, Series H: Audiovisual and Multimedia Systems, Infrastructure of audiovisual services—Coding of moving video, Advanced video coding for generic audiovisual services, The International Telecommunication Union, Oct. 2014, 540 pp.

Liu, et al., "Memory Efficient and Low Complexity Scalable Soft VLC Decoding for the Video Transmission," The 2004 IEEE Asia-Pacific Conference on Circuits and Systems Proceedings, Dec. 6-9, 2004, vol. 2, pp. 673-676.

Wang, et al., "An Enhanced Robust Entropy Coder for Video Codecs Based on Context-Adaptive Reversible VLC," Data Compression Conference, Mar. 27-29, 2007, DCC '07, pp. 406.

Wang, et al., "Context-Based 2D-VLC for Video Coding," IEEE International Conference on Multimedia and Expo, 2004 ICME '04, Jun. 27-30, 2004, vol. 1, pp. 89-92.

\* cited by examiner

VARIABLE LENGTH CODING OF VIDEO BLOCK COEFFICIENTS

CLAIM OF PRIORITY UNDER 35 U.S.C. §119

This application claims the benefit of U.S. Provisional Application Nos. 61/429,415 filed Jan. 3, 2011, 61/449,650 filed Mar. 5, 2011, and 61/505,514 filed Jul. 7, 2011, the entire contents of each of which are incorporated herein by reference.

TECHNICAL FIELD

This disclosure relates to video coding and compression. More specifically, this disclosure is directed to techniques for coding quantized transform coefficients using variable length coding (VLC).

BACKGROUND

In video coding, quantized transform coefficients, as well as motion vectors describing relative motion between a block to be encoded and a reference block, may be referred to as "syntax elements." Syntax elements, along with other control information, may form a coded representation of the video sequence. In some examples, prior to transmission from an encoder to a decoder, syntax elements may be entropy coded, thereby further reducing a number of bits needed for their representation. Entropy coding may be described as a lossless operation aimed at minimizing a number of bits required to represent transmitted or stored symbols (e.g., syntax elements) by utilizing properties of their distribution (e.g., some symbols occur more frequently than others).

One method of entropy coding employed by video coders is Variable Length Coding (VLC). According to VLC, a VLC codeword (a sequence of bits (0's and 1's)), may be assigned to each symbol (e.g., syntax element). VLC code words may be constructed such that a length of the codeword corresponds to how frequently the symbol represented by the codeword occurs. For example, more frequently occurring symbols may be represented by shorter VLC code words. In addition, VLC code words may be constructed such that the code words are uniquely decodable. For example if a decoder receives a valid sequence of bits of a finite length, there may be only one possible sequence of input symbols that, when encoded, would produce the received sequence of bits.

SUMMARY

This disclosure is directed to coding transform coefficients of a block of video data using variable length code (VLC) techniques of this disclosure. According to one aspect of this disclosure, techniques are described for mapping between at least one value and a code number cn based on a structured mapping (e.g., a mathematical relationship) for a first number of coefficients of a block of video data, and using a mapping table of a plurality of mapping tables stored in memory to map between the at least one value and the code number cn for a second number of coefficients of the block of video data.

The at least one value may include one or more of a value of a run syntax element and a value of a level_ID syntax element signaled according to a run encoding mode. The code number cn may indicate an index within a VLC table selected from one or more VLC tables. In some examples, the plurality of mapping tables stored in memory may each be configured to map between a code number cn and at least two syntax elements associated with a transform coefficient (e.g., both or level_ID and run values associated with a transform coefficient). For example, each table of the plurality of mapping tables may define a relationship between both of the run and level_ID syntax elements and the code number cn.

According to another aspect of this disclosure, techniques are described for coding a transform coefficient based on selectively using one of a first technique or a second technique to map between a level_ID syntax element and a run syntax element associated with the transform coefficient and a code number cn. According to these aspects, a coder may access a mapping table of a plurality of mapping tables stored in memory differently, dependent on a value associated with the code number cn or the level_ID syntax element. According to these aspects of this disclosure, the mapping table stored in memory does not define a relationship between the code number cn and both of the level_ID and run syntax elements as described above according to other aspects of this disclosure. Instead, the mapping table stored in memory may only define a relationship between the run syntax element and the code number cn.

In some examples, to map between a code number cn and the level_ID syntax element and the run syntax element by selectively using a first or second technique, a coder may determine a position k for a transform coefficient. Based on the position k, the coder may select a mapping table of a plurality of mapping tables stored in memory. The coder may further determine a value associated with the code number cn, or with the level_ID syntax element. The coder may, depending on the determined value, access the selected mapping table according to the first technique or the second technique to decode the transform coefficient. For example, according to the first technique, the coder may access the selected mapping table based on a first mathematical relationship. According to the second technique, the coder may access the selected mapping table based on a second mathematical relationship different than the first mathematical relationship.

In some examples, the various mapping techniques described herein may be used alone, or in combination to code transform coefficients of a block of video data. For example, a coder may code a first number of coefficients of a block of video data using a structured mapping as described above without using any mapping table stored in memory, and code a second number of coefficients by selectively using a first technique or a second technique to access a mapping table stored in memory depending on a value associated with one of a code number cn and a level_ID syntax element. According to another example, the coder may code a third number of coefficients by accessing a mapping table of a plurality of mapping tables stored in memory that each define a relationship between the code number cn and the run and level_ID syntax elements, as described above. A coder may use any of these techniques described herein, alone or in combination, to code different transform coefficients of a block of video data.

For example, a method for decoding a block of video data is described herein. The method includes mapping from a first code number cn for a first transform coefficient of a block of video data to a first at least one value associated with the first transform coefficient based on a first technique. The method further includes mapping from a second code number cn for a second transform coefficient of the block of video data to a second at least one value associated with the second transform coefficient based on a second technique different than the first technique. The method further includes using the first at least one value associated with the first transform coefficient and the second at least one value associated with the second transform coefficient to decode the block of video data.

According to another example, a device for decoding a block of video data is described herein. The device includes a VLC decoding module configured to map from a first code number cn for a first transform coefficient of a block of video data to a first at least one value associated with the first transform coefficient based on a first technique. The VLC decoding module is further configured to map from a second code number cn for a second transform coefficient of the block of video data to a second at least one value associated with the second transform coefficient based on a second technique different than the first technique. The VLC decoding module is further configured to use the first at least one value associated with the first transform coefficient and the second at least one value associated with the second transform coefficient to decode the block of video data.

According to another example, a device for decoding a block of video data is described herein. The device includes means for mapping from a first code number cn for a first transform coefficient of a block of video data to a first at least one value associated with the first transform coefficient based on a first technique. The device further includes means for mapping from a second code number cn for a second transform coefficient of the block of video data to a second at least one value associated with the second transform coefficient based on a second technique different than the first technique. The device further includes means for using the first at least one value associated with the first transform coefficient and the second at least one value associated with the second transform coefficient to decode the block of video data.

According to another example, a computer-readable storage medium that stores instructions is described herein. The instructions are configured to cause a computing device to map from a first code number cn for a first transform coefficient of a block of video data to a first at least one value associated with the first transform coefficient based on a first technique. The instructions are further configured to cause a computing device to map from a second code number cn for a second transform coefficient of the block of video data to a second at least one value associated with the second transform coefficient based on a second technique different than the first technique. The instructions are further configured to cause a computing device to use the first at least one value associated with the first transform coefficient and the second at least one value associated with the second transform coefficient to decode the block of video data.

According to another example, a method for encoding a block of video data is described herein. The method includes mapping from a first at least one value associated with the first transform coefficient to first code number cn based on a first technique. The method further includes mapping from a second at least one value associated with the second transform coefficient to second code number cn for a second transform coefficient of the block of video data to based on a second technique different than the first technique; the method further includes using the first code number cn to determine a first VLC codeword. The method further includes using the second code number cn to determine a second VLC codeword. The method further includes outputting the first VLC codeword and the second VLC codeword.

According to another example, a device for encoding a block of video data is described herein. The device includes a VLC encoding module configured to map from a first at least one value associated with the first transform coefficient to first code number cn based on a first technique. The VLC encoding module is further configured to map from a second at least one value associated with the second transform coefficient to second code number cn for a second transform coefficient of the block of video data based on a second technique different than the first technique. The VLC encoding module is further configured to use the first code number cn to determine a first VLC codeword. The VLC encoding module is further configured to use the second code number cn to determine a second VLC codeword. The VLC encoding module is further configured to output the first VLC codeword and the second VLC codeword.

According to another example, a device for encoding a block of video data is described herein. The device includes means for mapping from a first at least one value associated with the first transform coefficient to first code number cn based on a first technique. The device further includes means for mapping from a second at least one value associated with the second transform coefficient to second code number cn for a second transform coefficient of the block of video data based on a second technique different than the first technique. The device further includes means for using the first code number cn to determine a first VLC codeword. The device further includes means for using the second code number cn to determine a second VLC codeword. The device further includes means for outputting the first VLC codeword and the second VLC codeword.

According to another example, a computer-readable storage medium that stores instructions configured to cause a computing device to map from a first at least one value associated with the first transform coefficient to first code number cn based on a first technique. The instructions are further configured to cause the computing device to map from a second at least one value associated with the second transform coefficient to second code number cn for a second transform coefficient of the block of video data to based on a second technique different than the first technique. The instructions are further configured to cause the computing device to use the first code number cn to determine a first VLC codeword. The instructions are further configured to cause the computing device to use the second code number cn to determine a second VLC codeword. The instructions are further configured to cause the computing device to output the first VLC codeword and the second VLC codeword.

According to another example, a method of decoding a block of video data is described herein. The method includes determining a value of a code number cn based on a VLC codeword associated with a transform coefficient of a block of video data. The method further includes mapping from the code number cn to a level_ID syntax element and a run syntax element using a first technique or a second technique based on the value of the code number cn. The method further includes using the level_ID syntax element and the run syntax element to decode the block of video data.

According to another example, a device configured to decode at least one block of video data is described herein. The device includes a VLC decoding module configured to determine a value of a code number cn based on a VLC codeword associated with a transform coefficient of a block of video data. The VLC decoding module is further configured to map from the code number cn to a level_ID syntax element and a run syntax element using a first technique or a second technique based on the value of the codenumber cn; The VLC decoding module is further configured to use the level_ID syntax element and the run syntax element to decode the block of video data.

According to another example, a configured to decode at least one block of video data is described herein. The device includes means for determining a value of a code number cn based on a VLC codeword associated with a transform coefficient of a block of video data. The device further includes means for mapping from the code number cn to a level_ID syntax element and a run syntax element using a first technique or a second technique based on the value of the code number cn. The device further includes means for using the level_ID syntax element and the run syntax element to decode the block of video data.

According to another example, a computer-readable storage medium that stores instructions is described herein. The instructions cause a computing device to determine a value of a code number cn based on a VLC codeword associated with a transform coefficient of a block of video data. The instructions further cause the computing device to map from the code number cn to a level_ID syntax element and a run syntax element using a first technique or a second technique based on the value of the code number cn. The instructions further cause the computing device to use the level_ID syntax element and the run syntax element to decode the block of video data.

According to another example, a method of encoding at least one block of video data is described herein. The method includes determining a value of a level_ID syntax element and value of a run syntax element associated with a transform coefficient of a block of video data. The method further includes mapping from the determined level_ID value and the determined run value to a code number cn using a first technique or a second technique based on the value of the level_ID syntax element. The method further includes determining a VLC codeword based on the code number cn. The method further includes outputting the determined VLC codeword.

According to another example, a device configured to encode at least one block of video data is described herein. The device includes a VLC encoding module configured to determine a value of a level_ID syntax element and value of a run syntax element associated with a transform coefficient of a block of video data. The VLC encoding module is further configured to map from the determined level_ID value and the determined run value to a code number cn using a first technique or a second technique based on the value of the level_ID syntax element. The VLC encoding module is further configured to determine a VLC codeword based on the code number cn. The VLC encoding module is further configured to output the determined VLC codeword.

According to another example, a device configured to encode at least one block of video data is described herein. The device includes means for determining a value of a level_ID syntax element and value of a run syntax element associated with a transform coefficient of a block of video data. The device further includes means for mapping from the determined level_ID value and the determined run value to a code number cn using a first technique or a second technique based on the value of the level_ID syntax element. The device further includes means for determining a VLC codeword based on the code number cn. The device further includes means for outputting the determined VLC codeword.

According to another example, a computer-readable storage medium that stores instructions is described herein. The instructions cause a computing device to determine a value of a level_ID syntax element and value of a run syntax element associated with a transform coefficient of a block of video data. The instructions further cause the computing device to map from the determined level_ID value and the determined run value to a code number cn using a first technique or a second technique based on the value of the level_ID syntax element. The instructions further cause the computing device to determine a VLC codeword based on the code number cn. The instructions further cause the computing device to output the determined VLC codeword The details of one or more examples are set forth in the accompanying drawings and the description below. Other features, objects, and advantages of the invention will be apparent from the description and drawings, and from the claims.

DETAILED DESCRIPTION

Figure 1:
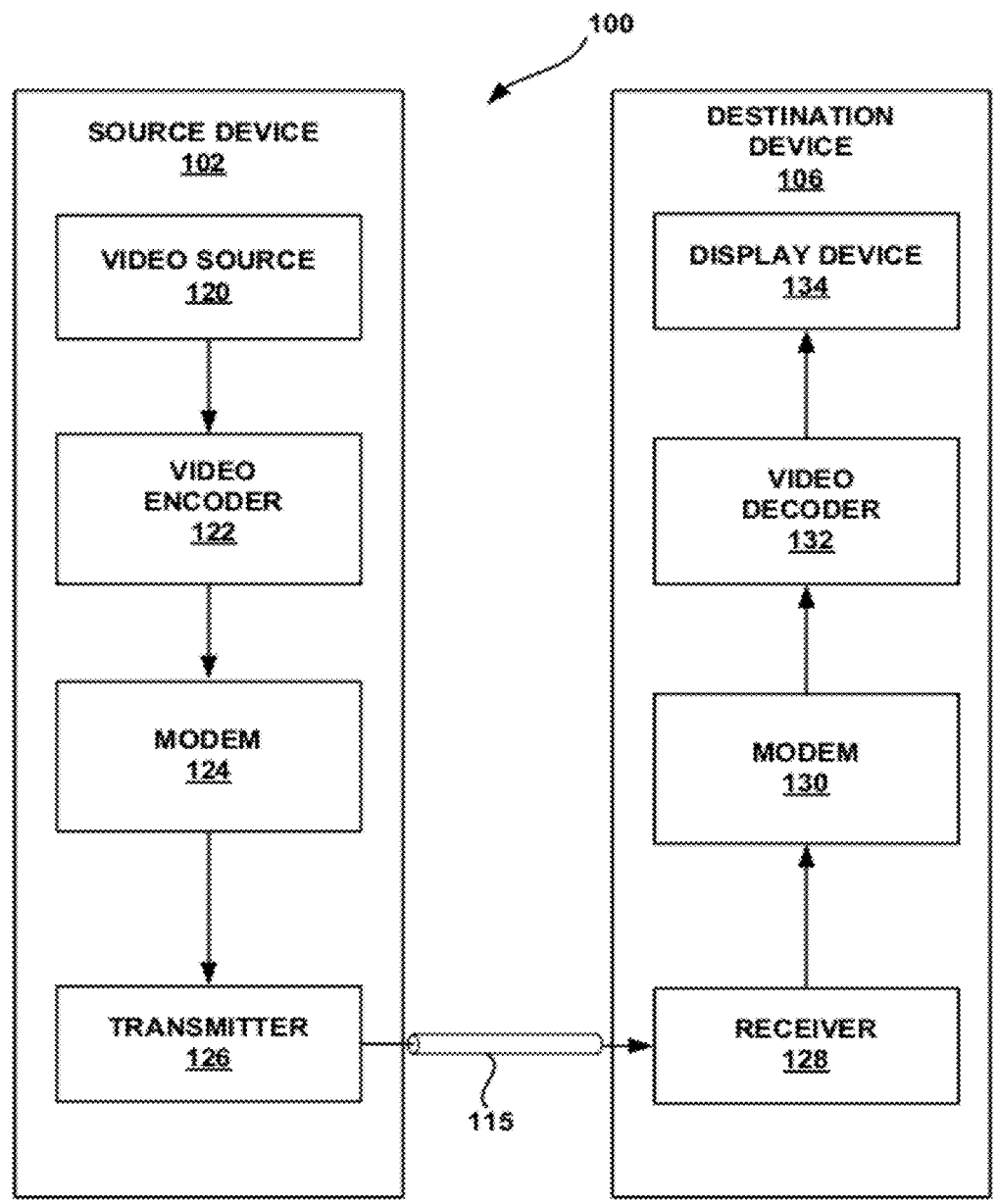
FIG. 1 is a block diagram that illustrates one example of a video encoding and decoding system consistent with the techniques of this disclosure.

This disclosure describes video coding techniques for coding (e.g., encoding or decoding) syntax elements (e.g., quantized transform coefficients) of a block of video data using one or more variable length code (VLC) code words of a VLC table. According to these techniques, an encoder may determine at least one value associated with a transform coefficient of a block, map the determined at least one value to a code number cn, and use the code number cn to access a VLC table. Based on the determined code number cn, the encoder may output a VLC code word that represents the determined values.

VLC code words of a VLC table may be constructed such that a length of the codeword corresponds to how frequently the symbol represented by the codeword occurs. For example, more frequently occurring symbols may be represented by shorter VLC code words. In addition, VLC code words may be constructed such that the code words are uniquely decodable. For example if a decoder receives a valid sequence of bits of a finite length, there may be only one possible sequence of input symbols that, when encoded, would produce the received sequence of bits.

A decoder may receive a VLC code word from an encoder, and use the VLC code word to determine the signaled at least one value associated with the transform coefficient in order to decode the transform coefficient. For example, the decoder may access a VLC table (e.g., the same VLC table as used by the encoder as described above), and determine a code number for the VLC code word. The decoder may map the determined code number cn to at least one value associated with the transform coefficient. By using VLC code words to signal, from an encoder to a decoder, one or more values associated with transform coefficients of a block of video data, an amount of data used to code (e.g., encode or decode) a block of video data may be reduced.

In some examples, coefficients of a given block of a video frame may be ordered (scanned) according to a zigzag scanning technique. Such a technique may be used to convert a two-dimensional block of coefficients into a one-dimensional representation of the coefficients, which may be referred to as a one-dimensional coefficient vector of the coefficients. A zig-zag scanning technique may begin at an upper leftmost coefficient of a block, and proceeding to scan in a zig-zag pattern to a lower rightmost coefficient of the block.

According to a zigzag scanning technique, it may be presumed that transform coefficients having a greatest energy (e.g., a greatest coefficient value) correspond to low frequency transform functions and may be located towards a top-left of a block. As such, for a coefficient vector (e.g., one-dimensional coefficient vector of the coefficients) produced based on zigzag scanning, higher magnitude coefficients may be assumed to most likely appear towards a start of the one-dimensional coefficient vector. It may also be assumed that, after a coefficient vector has been quantized, most low energy coefficients may be equal to 0. In some examples, coefficient scanning may be adapted during coefficient coding. For example a lower number in the scan may be assigned to positions for which non-zero coefficients are statistically more probable. Although many of the techniques of this disclosure will be described from the perspective of zig-zag scans (and/or inverse zig-zag scans), other scans (e.g., horizontal scans, vertical scans, combinations of horizontal, vertical and/or zig-zag scans, adaptive scans or other scans) could also be used According to one example, a coder (i.e., an encoder or a decoder) may perform an inverse zig-zag scan. According to an inverse zig-zag scan, the coder may begin coding at a location that corresponds to a last non-zero coefficient (e.g., a non-zero coefficient furthest from an upper left position of the block). The encoder may code in a zig-zag pattern as described above, but beginning in a bottom right position of the block and ending in an upper left position of the block.

According to some examples, a coder may be configured to operate in multiple different coding modes when performing a scan of transform coefficients. According to one such example, a coder may switch between a run coding mode and a level mode of coding based on magnitudes of one or more already coded coefficients.

According to a level coding mode, an encoder may signal a magnitude (|level|) of each coefficient. For example, the encoder may signal the magnitude (|level|) using a VLC table of a plurality of VLC tables (e.g., a table VLC[x], where x is zero for a first coefficient that is being coded in the level mode). According to a level coding mode, after decoding each coefficient, if |level| of the syntax element has a magnitude greater than a predetermined value (e.g., vlc_level_table[x]), then the value x may be incremented by one.

According to a run coding mode, a coder may signal a level_ID value and a/or run value associated with a scanned coefficient, as well as other values. The level_ID syntax element may indicate whether a non-zero coefficient has an amplitude of one or an amplitude greater than one. The run syntax element that may indicate a number of quantized coefficients with an amplitude of zero between a current (currently coded) coefficient and a next non-zero coefficient in scan order (e.g., an inverse zig-zag scan order). A current coefficient may refer to a first coefficient of a run to a next non-zero coefficient according to a scan order. According to one example, run may have a value in a range from zero to k+1, wherein k is a position index value of the current coefficient in a scan. According to a run coding mode, an encoder may determine values for run and level_ID, and signal the values for run and level_ID as a VLC code word. In some examples, the encoder may further combine (e.g., concatenate) the run and level_ID values as a single syntax element. Such a single syntax element may be referred to as IsLevelOne_Run.

To determine a VLC code word, an encoder may access a mapping table of a plurality of mapping tables that defines a mapping between the values run and level_ID and a code number cn. Such a mapping table may be selected by an encoder based on a position k of a coefficient in the scan order. For example, a first such mapping table may be used for a position k equal to zero, and a second, different mapping table may be used for a position k equal to one. Position k may be described to as a number of coefficients between a current coefficient and a last coefficient in scan order. Again, although the techniques are described according to zig-zag and inverse zig-zag scans, similar techniques could apply to any scan order.

The code number cn may represent an index within a VLC table of a plurality of VLC tables. The encoder may select a VLC table from among a plurality of VLC tables based on a position k of a current coefficient in scan order. Based on the code number cn, the encoder may determine a VLC code word using the selected VLC table. The encoder may signal such a determined VLC code word to a decoder. The decoder may decode a code number cn based on the received VLC code word, and then use the code number cn to determine at least one value associated with a transform coefficient (e.g., run and/or level_ID values) of a block of video data. The decoder may use the determined at least one value to decode the block of video data.

According to some aspects, this disclosure describes using different techniques to map between at least one value (e.g., a value of a level_ID syntax element and/or a run syntax element) associated with the transform coefficients and a code number cn, for different transform coefficients of a block of video data. For example, this disclosure describes a coder configured to, for a first number of coefficients of a block of video data, map between the at least one value and the code number cn using a first technique. For a second number of coefficients of the block, the coder may map between the at least one value and the code number cn using a second technique different than the first technique. For example, the first technique may include mapping based on a structured mapping, and the second technique may include mapping using a mapping table of a plurality of mapping tables stored in memory. In some examples, such a plurality of mapping tables may each define a relationship between the code number cn and the level_ID syntax element and the run syntax element. In some examples, using different mapping techniques for different coefficients of a block of video data may reduce and/or eliminate a number and/or size of mapping tables stored in memory to code a block of video data, and thereby reduce a complexity and/or improve an efficiency of coding.

According to other aspects of this disclosure, a coder may be configured to code a transform coefficient based on using one of a first technique (e.g., a first mathematical relationship) or a second technique (a second mathematical relationship) to map between a level_ID syntax element and a run syntax element and a code number cn associated with a transform coefficient. For example, according to these aspects of this disclosure, a coder may determine a value associated with one of the code number cn or the level_ID syntax element. The coder may, based on the determined value, use one of the first technique or the second technique to access a mapping table stored in memory. The mapping table may be selected by the coder from among a plurality of mapping tables that each defines a relationship between the run syntax element and the code number cn. The first technique may include accessing the selected mapping table using a first mathematical relationship, while the second technique includes accessing the selected mapping table using a second mathematical relationship different than the first mathematical relationship.

The techniques described herein may be performed by an encoder or a decoder. For example, an encoder may use the various mapping techniques described herein, alone or in combination, to determine the code number cn based on determined level_ID and run syntax elements associated with a transform coefficient of a block of video data. As another example, a decoder may use the various mapping techniques described herein, alone or in combination, to determine level_ID and run syntax elements associated with the transform coefficient based on a determined code number cn.

FIG. 1 is a block diagram illustrating an exemplary video encoding and decoding system 100 that may implement techniques of this disclosure. As shown in FIG. 1, system 100 includes a source device 102 that transmits encoded video to a destination device 106 via a communication channel 115. Source device 102 and destination device 106 may comprise any of a wide range of devices. In some cases, source device 102 and destination device 106 may comprise wireless communication device handsets, such as so-called cellular or satellite radiotelephones. The techniques of this disclosure, however, which apply generally to the encoding and decoding transform coefficients of video data, are not necessarily limited to wireless applications or settings, and may be applied to a wide variety of non-wireless devices that include video encoding and/or decoding capabilities.

In the example of FIG. 1, source device 102 may include a video source 120, a video encoder 122, a modulator/demodulator (modem) 124 and a transmitter 126. Destination device 106 may include a receiver 128, a modem 130, a video decoder 132, and a display device 134. In accordance with this disclosure, video encoder 122 of source device 102 may be configured to encode at least one value associated with a transform coefficient (e.g., run and/or level_ID values) based on determining a code number cn. For example, video encoder 122 may use the determined code number cn to determine a VLC code word that represents the at least one value associated with the transform coefficient.

According to some aspects of this disclosure, video encoder 122 may determine the code number cn using different techniques for different coefficients of a block of video data. For example, video encoder 122 may use a first technique to determine code numbers cn for a first number of coefficients of the block of video data, and a second technique to determine code number cn for a second number of coefficients of the block. The first technique includes using a structured mapping (e.g., a mathematical relationship) to determine the code numbers cn. The second technique includes using a mapping table of a plurality of mapping tables stored in memory to determine the code numbers cn. In some examples, such a plurality of mapping tables may each define a relationship between a run syntax element and a level_ID syntax element and the code number cn. In some examples, video encoder 122 may be configured to determine whether to use the first or second technique based on a position k of a transform coefficient. For example, video encoder may compare a position k of a currently encoded transform coefficient to a predetermined threshold T (e.g., a predetermined threshold stored in memory), and use one of the first technique or second technique described above to map at least one value associated with a transform coefficient (e.g., run and level_ID values) to a code number cn for the transform coefficient based on the comparison.

According to other aspects of this disclosure, video encoder 122 may, for a transform coefficient of a block of video data, selectively use a first technique or a second technique to map from a determined level_ID syntax element and a determined run syntax element associated with the transform coefficient to determine a code number cn based on a value of the level_ID syntax element. According to the first technique, video encoder 122 may access a selected mapping table of a plurality of mapping tables stored in memory differently than according to the second technique.

According to both of the first and second techniques, video encoder 122 may determine a value of the level_ID and run syntax elements, and also determine a position k for the transform coefficient. Based on the position k, video encoder 122 may select a mapping table from a plurality of mapping tables stored in memory.

In some examples, video encoder 122 may use the first technique or the second technique to access the selected mapping table, based on the determined value of the level_ID syntax element. For example, if the level_ID value has a first value (e.g., level_ID=0), video encoder 122 may use a first technique that includes using a first mathematical relationship to access the selected mapping table. However, if the at least one syntax element has a second value (e.g., level_ID=1), video encoder 122 may use a second technique that includes using a second mathematical relationship different than the first mathematical relationship to access the selected mapping table.

In some examples, the plurality of mapping tables may each define a relationship between the code number cn and run syntax element. The various techniques described herein for mapping between a code number cn and at least one syntax element may be used independently, or jointly, by video encoder 122 to code transform coefficients of a block of video data.

Blocks of video data generally comprise residual blocks of transform coefficients. The transform coefficients may be produced by transforming residual pixel values indicative of differences between a predictive block and the original block being coded. The transform may be an integer transform, a DCT transform, a DCT-like transform that is conceptually similar to DCT, or the like. Transforms may be implemented according to a so-called butterfly structure for transforms, or may be implemented as matrix multiplications.

Reciprocal transform coefficient decoding may also be performed by video decoder 132 of destination device 106. That is, video decoder 132 may be configured to receive a VLC code word associated with a transform coefficient, determine a code number cn for the transform coefficient, and determine at least one value associated with the transform coefficients (e.g., run and/or level_ID values) based on mapping between the determined code number cn and the at least one value. In some examples, video decoder 132 may determine the at least one value using different techniques for different coefficients of a block of video data. For example, according to some aspects of this disclosure, video decoder 132 may use a first technique to determine the at least one value associated with a first coefficient (or first plurality of coefficients) of the block of video data, and a second technique to determine the at least one value for a second coefficient (or a second plurality of coefficients) of the block. The first technique may include using a structured mapping (e.g., a mathematical relationship) to determine the at least one value (e.g., run and/or level_ID values) associated with the first coefficient.

The second technique may include using a mapping table of a plurality of mapping tables stored in memory to determine the at least one value. The at least one value may include a value of one or more of a run syntax element and a level_ID syntax element. According to these aspects of this disclosure, such a plurality of mapping tables may each define a relationship between the code number cn and the run syntax element and the level_ID syntax element.

In some examples, video decoder 132 may be configured to determine whether to use the first or second technique based on a position k of a transform coefficient. For example, video decoder 132 may compare a position k of a currently decoded transform coefficient to a predetermined threshold T (e.g., a predetermined threshold stored in memory), and use one of the first technique or second technique described above to determine at least one value (e.g., run and/or level_ID values) associated with the transform coefficient based on the comparison.

According to another aspect of this disclosure, video decoder 132 may, for a transform coefficient of a block of video data, use a first technique (e.g., a first mathematical relationship) or a second technique (e.g., a second mathematical relationship) to map from a determined code number cn to determine a value of a level_ID syntax element and a value of a run syntax element, depending on a determined value of the code number cn. According to the first technique, video decoder 132 may access a mapping table selected (e.g., based on a position k of the transform coefficient) from a plurality of mapping tables stored in memory differently than according to the second technique. For example, the first technique may include accessing the selected mapping table based on a first mathematical relationship, while the second technique includes accessing the selected mapping table based on a second mathematical relationship different than the first mathematical relationship. In some examples, the plurality of mapping tables stored in memory may each define a relationship between the run syntax element and the code number cn.

Video decoder 132 may use the various techniques described herein, alone or in combination, to map between a determined code number cn and the level_ID value and the run value to determine values of the level_ID syntax element and the run syntax element. Video decoder 132 may use determined values of the level_ID syntax element and the level_ID syntax element to decode the block of video data.

The illustrated system 100 of FIG. 1 is merely exemplary. The transform coefficient encoding and decoding techniques of this disclosure may be performed by any encoding or decoding devices. Source device 102 and destination device 106 are merely examples of coding devices that can support such techniques.

Video encoder 122 of source device 102 may encode video data received from video source 120. Video source 120 may comprise a video capture device, such as a video camera, a video archive containing previously captured video, or a video feed from a video content provider. As a further alternative, video source 120 may generate computer graphics-based data as the source video, or a combination of live video, archived video, and computer-generated video. In some cases, if video source 120 is a video camera, source device 102 and destination device 106 may form so-called camera phones or video phones. In each case, the captured, pre-captured or computer-generated video may be encoded by video encoder 122.

In system 100, once the video data is encoded by video encoder 122, the encoded video information may then be modulated by modem 124 according to a communication standard, e.g., such as code division multiple access (CDMA) or any other communication standard or technique, and transmitted to destination device 106 via transmitter 126. Modem 124 may include various mixers, filters, amplifiers or other components designed for signal modulation. Transmitter 126 may include circuits designed for transmitting data, including amplifiers, filters, and one or more antennas. Receiver 128 of destination device 106 receives information over channel 115, and modem 130 demodulates the information. Again, the video decoding process performed by video decoder 132 may include similar (e.g., reciprocal) decoding techniques to the encoding techniques performed by video encoder 122.

Communication channel 115 may comprise any wireless or wired communication medium, such as a radio frequency (RF) spectrum or one or more physical transmission lines, or any combination of wireless and wired media. Communication channel 115 may form part of a packet-based network, such as a local area network, a wide-area network, or a global network such as the Internet. Communication channel 115 generally represents any suitable communication medium, or a collection of different communication media, for transmitting video data from source device 102 to destination device 106.

Although not shown in FIG. 1, in some aspects, video encoder 122 and video decoder 132 may each be integrated with an audio encoder and decoder, and may include appropriate MUX-DEMUX units, or other hardware and software, to handle encoding of both audio and video in a common data stream or separate data streams. If applicable, MUX-DEMUX units may conform to the ITU H.223 multiplexer protocol, or other protocols such as the user datagram protocol (UDP).

Video encoder 122 and video decoder 132 each may be implemented as one or more microprocessors, digital signal processors (DSPs), application specific integrated circuits (ASICs), field programmable gate arrays (FPGAs), discrete logic, software, hardware, firmware or any combinations thereof. Each of video encoder 122 and video decoder 132 may be included in one or more encoders or decoders, either of which may be integrated as part of a combined encoder/decoder (CODEC) in a respective mobile device, subscriber device, broadcast device, server, or the like.

In some cases, devices 102, 106 may operate in a substantially symmetrical manner. For example, each of devices 102, 106 may include video encoding and decoding components. Hence, system 100 may support one-way or two-way video transmission between video devices 102, 106, e.g., for video streaming, video playback, video broadcasting, or video telephony.

During the encoding process, video encoder 122 may execute a number of coding techniques or operations. In general, video encoder 122 operates on video blocks within individual video frames (or other independently coded units such as slices) in order to encode the video blocks. Frames, slices, portions of frames, groups of pictures, or other data structures may be defined as independent data units that include a plurality of video blocks, and syntax elements may be included at such different independent data units. The video blocks within independent data units may have fixed or varying sizes, and may differ in size according to a specified coding standard. In some cases, each video frame may include a series of independently decodable slices, and each slice may include one or more macroblocks or LCUs.

Macroblocks are one type of video block defined by the ITU H.264 standard and other standards. Macroblocks typically refer to 16 by 16 blocks of data. The ITU-T H.264 standard supports intra prediction in various block sizes, such as 16 by 16, 8 by 8, or 4 by 4 for luma components, and 8 by 8 for chroma components, as well as inter prediction in various block sizes, such as 16 by 16, 16 by 8, 8 by 16, 8 by 8, 8 by 4, 4 by 8 and 4 by 4 for luma components and corresponding scaled sizes for chroma components.

The emerging HEVC standard defines new terms for video blocks. In particular, with HEVC, video blocks (or partitions thereof) may be referred to as "coded units." With the HEVC standard, largest coded units (LCUs) may be divided into smaller and smaller coded units (CUs) according to a quadtree partitioning scheme, and the different CUs that are defined in the scheme may be further partitioned into so-called prediction units (PUs) and/or transform units (TUs). The LCUs, CUs, and PUs, and TUs are all video blocks within the meaning of this disclosure. Other types of video blocks may also be used, consistent with the HEVC standard or other video coding standards. Thus, the phrase "block" refers to any size of video block. Moreover, video blocks may sometimes refer to blocks of video data in the pixel domain, or blocks of data in a transform domain such as a discrete cosine transform (DCT) domain, a domain similar to DCT, a wavelet domain, or the like.

Referring again to FIG. 1, video encoder 122 may perform predictive coding in which a video block being coded is compared to another block of video data in order to identify a predictive block. This process of predictive coding is often referred to as motion estimation and motion compensation. Motion estimation estimates video block motion relative to one or more predictive video blocks of one or more predictive frames (or other coded units). Motion compensation generates the desired predictive video block from the one or more predictive frames or other coded units. Motion compensation may include an interpolation process in which interpolation filtering is performed to generate predictive data at fractional pixel precision.

After generating the predictive block, the differences between the current video block being coded and the predictive block are coded as a residual block, and prediction syntax (such as a motion vector) is used to identify the predictive block. The residual block may be transformed and quantized. Transform techniques may comprise a DCT process or conceptually similar process, integer transforms, wavelet transforms, or other types of transforms. In a DCT or DCT-like process, as an example, the transform process converts a set of pixel values (e.g., residual values) into transform coefficients, which may represent the energy of the pixel values in the frequency domain. Quantization is typically applied on the transform coefficients, and generally involves a process that limits the number of bits associated with any given transform coefficient.

Following transform and quantization, entropy coding may be performed on the transformed and quantized residual video blocks. Syntax elements, (e.g., the run and level_ID values described herein), various filter syntax information, and prediction vectors defined during the encoding may be included in the entropy-coded bitstream. In general, entropy coding comprises one or more processes that collectively compress a sequence of quantized transform coefficients and/or other syntax information. Scanning techniques, such as zig-zag scanning (and/or inverse zig-zag scanning) techniques, are performed on the quantized transform coefficients in order to define one or more serialized one-dimensional vectors of coefficients from two-dimensional video blocks. Again, other scan orders, including fixed or adaptive scan orders, could also be used consistent with this disclosure. The scanned coefficients are then entropy coded along with any syntax information in a manner as described herein.

As part of the encoding process, encoded video blocks may be decoded to generate the video data used for subsequent prediction-based coding of subsequent video blocks. At this stage, filtering may be employed in order to improve video quality, and e.g., remove blockiness or other artifacts from decoded video. This filtering may be in-loop or post-loop. With in-loop filtering, the filtering of reconstructed video data occurs in the coding loop, which means that the filtered data is stored by an encoder or a decoder for subsequent use in the prediction of subsequent image data. In contrast, with post-loop filtering, the filtering of reconstructed video data occurs out of the coding loop, which means that unfiltered versions of the data are stored by an encoder or a decoder for subsequent use in the prediction of subsequent image data.

Figure 2:
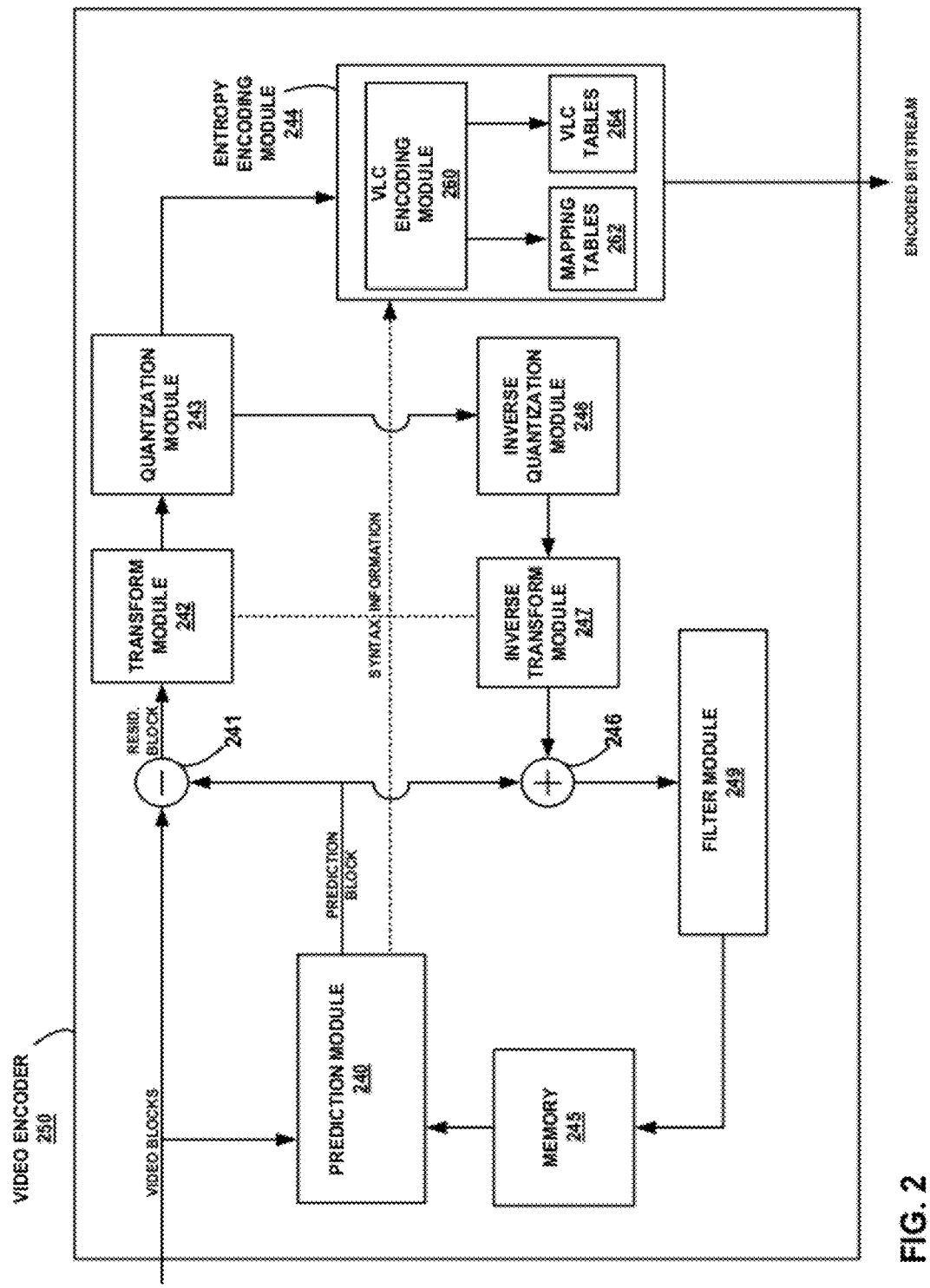
FIG. 2 is a block diagram that illustrates one example of a video encoder consistent with the techniques of this disclosure.

FIG. 2 is a block diagram illustrating an example video encoder 250 consistent with this disclosure. Video encoder 250 may correspond to video encoder 122 of source device 102, or a video encoder of a different device. As shown in FIG. 2, video encoder 250 includes a prediction module 240, adders 241 and 246, and a memory 245. Video encoder 250 also includes a transform module 242 and a quantization module 243, as well as an inverse quantization module 248 and an inverse transform module 247. Video encoder 250 also includes an entropy coding module 244. Entropy coding module 244 includes a VLC encoding module 260.

According to some aspects of this disclosure, VLC encoding module 260 may map from a determined at least one value (e.g., a value of a level_ID and/or a run syntax element) associated with a transform coefficient to determine a code number cn. According to some aspects of this disclosure, VLC encoding module 260 may map the at least one value associated with a first number of coefficients of the block to a first code number cn using a first technique, and map at least one value associated with a second number of coefficients of the block to a second code number cn using a second technique different than the first technique. According to the first technique, VLC encoding module 260 may map the at least one value to a code number cn based on a structured mapping (e.g., a mathematical relationship). According to the second technique, VLC encoding module 260 may map the at least one value to a code number cn based on accessing one or more mapping tables 262 (e.g., stored in a memory 245 of video encoder 250). According to the second technique, the plurality of mapping tables 262 may each define a relationship between the code number cn and a run syntax element and a level_ID syntax element associated with a transform coefficient.

According to the first technique, entropy coding module 246 may not access one or more mapping tables 262 previously stored in memory 245 of video encoder 250 that define a mapping between at least one value associated with a transform coefficient (e.g., level_ID and/or run values) and a code number cn. Instead, VLC encoding module 260 may use a mathematical relationship to determine the code number cn. In some examples, VLC encoding module 260 may determine whether to use the first technique or the second technique for a current transform coefficient (e.g., currently encoded transform coefficient) based on comparing of a position k of the current transform coefficient to a predetermined threshold.

According to another aspect of this disclosure, to encode a transform coefficient, VLC encoding module 260 may, based on a determined value of a level_ID syntax element, selectively use a first technique (e.g., a first mathematical relationship) or a second technique (e.g., a second mathematical relationship) to map from a determined level_ID syntax element and a determined run syntax element to determine a code number cn. For example, VLC encoding module 260 may determine a position k of a current transform coefficient, and values of the level_ID syntax element and the run syntax element. Based on the determined position k, VLC encoding module 260 may select a mapping table of a plurality of mapping tables 262 stored in memory 245. Depending on a value of the level_ID syntax element, VLC encoding module 260 may further use one of the first technique or the second technique to access the selected mapping table, to determine the code number cn.

According to these aspects of this disclosure, such a plurality of mapping tables 262 may define a relationship between the run syntax element and the code number cn. In contrast with the plurality of mapping tables 262 described above according to other aspects of this disclosure, such a plurality of mapping tables 262 may not define a relationship between both the run syntax element and the level_ID syntax element, and the code number cn.

Once VLC encoding module 260 has determined a code number cn using one or more of the mapping techniques described herein, VCL encoding module 260 may access one or more VLC tables 264 to determine a VLC code word that represents the at least one value (e.g., level_ID and/or run values). Video encoder 250 may output the determined VLC code word. For example, video encoder 250 may output the determined VLC code word to a decoder, as part of an entropy encoded bit stream of video data.

VLC tables 264 and mapping tables 262 are illustrated as part of entropy coding module 244 insofar as VLC encoding module 260 applies the respective tables. The VLC tables 264 and mapping tables 262, however, may actually be stored in a memory location, such as memory 245, which may be accessible by VLC module 260 to apply the respective tables.

During the encoding process, video encoder 250 receives a video block to be coded, and prediction module 240 performs predictive coding techniques. For inter coding, prediction module 240 compares the video block to be encoded to various blocks in one or more video reference frames or slices in order to define a predictive block. For intra coding, prediction module 240 generates a predictive block based on neighboring data within the same frame, slice, or other unit of video data. Prediction module 240 outputs the prediction block and adder 241 subtracts the prediction block from the video block being coded in order to generate a residual block.

For inter coding, prediction module 240 may comprise motion estimation and motion compensation modules (not depicted in FIG. 2) that identify a motion vector that points to a prediction block and generates the prediction block based on the motion vector. Typically, motion estimation is considered the process of generating the motion vector, which estimates motion. For example, the motion vector may indicate the displacement of a predictive block within a predictive frame relative to the current block being coded within the current frame. Motion compensation is typically considered the process of fetching or generating the predictive block based on the motion vector determined by motion estimation. For intra coding, prediction module 240 generates a predictive block based on neighboring data within the same frame, slice, or other unit of video data. One or more intra-prediction modes may define how an intra prediction block can be defined.

Motion compensation for inter-coding may include interpolations to sub-pixel resolution. Interpolated predictive data generated by prediction module 240, for example, may be interpolated to half-pixel resolution, quarter-pixel resolution, or even finer resolution. This permits motion estimation to estimate motion of video blocks to such sub-pixel resolution.

After prediction module 240 outputs the prediction block, and after adder 241 subtracts the prediction block from the video block being coded in order to generate a residual block, transform module 242 applies a transform to the residual block. The transform may comprise a discrete cosine transform (DCT), an integer transform, or a conceptually similar transform such as that defined by the ITU H.264 standard, the HVEC standard, or the like. In some examples, transform module 242 may perform differently sized transforms and may select different sizes of transforms for coding efficiency and improved compression. Wavelet transforms, integer transforms, sub-band transforms or other types of transforms may also be used. In any case, transform module 242 applies a particular transform to the residual block of residual pixel values, producing a block of residual transform coefficients. The transform may convert the residual pixel value information from a pixel domain to a frequency domain.

Inverse quantization module 248 and inverse transform module 247 apply inverse quantization and inverse transform, respectively, to reconstruct the residual block in the pixel domain. Summer 246 adds the reconstructed residual block to the prediction block produced by prediction module 240 to produce a reconstructed video block for storage in memory 245. Filter module 249 may perform in-loop or post loop filtering on reconstructed video blocks.

Memory 245 may store a frame or slice of blocks for use in motion estimation with respect to blocks of other frames to be encoded. Prior to such storage, in the case of in-loop filtering, filter module 249 may apply filtering to the video block to improve video quality. Such filtering by filter module 249 may reduce blockiness or other artifacts. Moreover, filtering may improve compression by generating predictive video blocks that comprise close matches to video blocks being coded. Filtering may also be performed post-loop such that the filtered data is output as decoded data, but unfiltered data is used by prediction module 240.

Quantization module 243 quantizes the residual transform coefficients (e.g., from transform module 242) to further reduce bit rate. Quantization module 243, for example, may limit the number of bits used to code each of the coefficients. After quantization, entropy encoding module 244 may scan and entropy encode the data. For example, entropy encoding module 244 may scan the quantized coefficient block from a two-dimensional representation to one or more serialized one-dimensional vectors. The scan order may be pre-programmed to occur in a defined order (such as zig-zag scanning, inverse zig-zag scanning, horizontal scan, vertical scan, or another pre-defined order), or possibly adaptively defined based on previous coding statistics. Following this scanning process, entropy encoding module 244 encodes the quantized transform coefficients (along with any syntax elements) according to an entropy coding methodology as described herein to further compress the data. Syntax information included in the entropy coded bitstream may include prediction syntax from prediction module 240, such as motion vectors for inter coding or prediction modes for intra coding. Syntax information included in the entropy coded bitstream may also include filter information, such as that applied for interpolations by prediction module 240 or filters applied by filter module 249. In addition, syntax information included in the entropy coded bitstream may also include one or more VLC code words that represent level_ID and run values (or other values) associated with transform coefficients of a block of video data, and the techniques of this disclosure specifically define VLC coding of level_ID and run values.

The techniques of this disclosure may be considered a type of CAVLC technique. CAVLC techniques use VLC tables in a manner that effectively compresses serialized "runs" of transform coefficients and/or other syntax elements. Similar techniques might also be applied in other types of entropy coding such as context adaptive binary arithmetic coding (CABAC).

In some examples, a video coder (e.g., encoder, decoder) may be configured to use VLC as a binarization scheme for CABAC to code transform coefficients. For example, a video encoder operating to use CABAC may be configured to use VLC techniques, such as those described herein, to encode the transform coefficients into a stream of binary values. According to these examples, such binary values may then be coded using CABAC. In some examples, using VLC as a binarization scheme for CABAC may generate less binary values (i.e., less bits of data) for a CABAC coder (e.g., encoder, decoder) to code in comparison to other techniques, which may improve the throughput of CABAC coding performed by the coder. In some examples, binarized values generated using VLC as a binarization scheme for CABAC may be coded using a CABAC bypass mode, where each binary value may be assumed to be equally likely to have a value of 0 or 1. In some examples, coding using such a CABAC bypass mode may be simpler than other standard CABAC coding techniques.

In some examples, a video coder as described herein may be configured to transition between using VLC and using other techniques as the binarization process for CABAC. For example, a video coder may be configured to use VLC to binarize some transform coefficients, and use another technique to binarize of other coefficients. In some examples, such a video coder may dynamically determine whether to use VLC as the binarization process of CABAC or some other technique, based on one or more characteristics of video data being coded.

According one or more aspects of this disclosure, techniques are described for coding transform coefficients using VLC. Any of these techniques may be used alone to code one or more transform coefficients of video data, or in combination with one or more other techniques for coding transform coefficients of video data, such as CABAC techniques. For example, any of the VLC coding techniques described herein may be used as a binarization scheme for CABAC to code transform coefficients, as described above.

Following the entropy coding by entropy encoding module 244, the encoded video may be transmitted to another device or archived for later transmission or retrieval. Again, the encoded video may comprise the entropy coded vectors and various syntax, which can be used by a decoder to properly configure the decoding process. For example, a decoder may use one or more VLC code words that represent level_ID and run syntax elements associated with a transform coefficient, and use the VLC code word to decode the encoded video.

Figure 3:
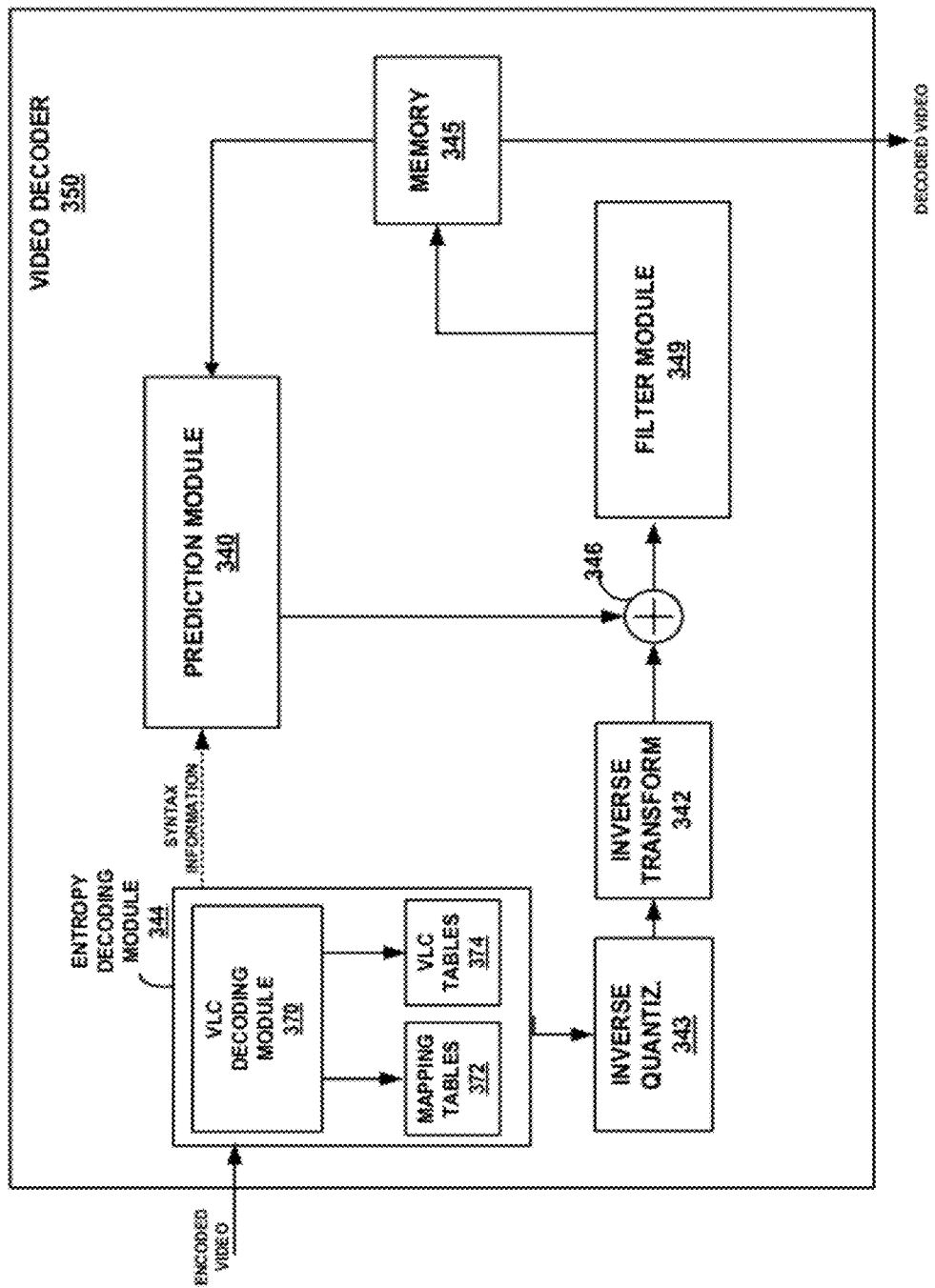
FIG. 3 is a block diagram that illustrates one example of a video decoder consistent with the techniques of this disclosure.

FIG. 3 is a block diagram illustrating an example of a video decoder 350, which decodes a video sequence that is encoded in the manner described herein. The received video sequence may comprise an encoded set of image frames, a set of frame slices, a commonly coded group of pictures (GOPs), or a wide variety of coded video units that include encoded video blocks and syntax information to define how to decode such video blocks.

Video decoder 250 includes an entropy decoding module 344, which performs the reciprocal decoding function of the encoding performed by entropy encoding module 244 of FIG. 2. In particular, entropy decoding module 344 may perform CAVLC techniques as described herein as reciprocal entropy coding to that applied by entropy encoding module 244 of FIG. 2. In this manner, entropy decoding module 344 may convert entropy decoded video blocks in a one-dimensional serialized format from one or more one-dimensional vectors of coefficients back into a two-dimensional block format. The number and size of the vectors, as well as the scan order defined for the video blocks may define how the two-dimensional block is reconstructed. Entropy decoded prediction syntax may be sent from entropy decoding module 344 to prediction module 340.

As also depicted in FIG. 3, entropy decoding module 344 includes a VLC decoding module 370. VLC decoding module 370 may receive a VLC code word that represents at least one value (e.g., a value of one or more of a level_ID syntax element and/or a run syntax element) associated with a transform coefficient, and access VLC tables 372 to determine a code number cn. VLC decoding module 370 may further determine the at least one value (e.g., the value of one or more of the level_ID and syntax elements) associated with the transform coefficient based on mapping between the at least one value and the determined code number cn.

According to some aspects of this disclosure, VLC decoding module 370 may map a first code number cn to at least one value associated with a first coefficient (or number of coefficients) of a block using a first technique, and use a second, different technique to map a second code number cn to at least one value associated with a second coefficient (or second number of coefficients) of the block. According to the first technique, VLC decoding module 370 may map a code number cn to the at least one value (e.g., level_ID and/or run values) based on a structured mapping (e.g., a mathematical relationship). According to the second technique, VLC decoding module 370 may map a code number cn to the at least one value based on accessing a mapping table of a plurality of mapping tables 372 (e.g., stored in a memory 345 of video decoder 350). According to the first technique, VLC decoding module 370 may not access one or more mapping tables 372 previously stored in memory 345 of video decoder 350 that define a mapping between a code number cn and the at least one value (e.g., level_ID and/or run values). In some examples, the plurality of mapping tables 372 used according to the second technique each define a relationship between the code number cn and the level_ID syntax element and the run syntax element. In some examples, VLC decoding module 370 may determine whether to use the first technique or the second technique for a current transform coefficient (e.g., currently decoded transform coefficient) based on comparing of a position k of a transform coefficient to a predetermined threshold.

According to another aspect of this disclosure, to decode a transform coefficient, VLC decoding module 370 may selectively use a first technique (e.g., a first mathematical relationship) or a second technique (e.g., a second mathematical relationship) to map from a code number cn to a level_ID and a run syntax element based on a determined value for the code number cn. For example, VLC decoding module 370 may determine a value of the code number cn, and a position k for the transform coefficient. Based on the position k, VLC decoding module 370 may select a mapping table of a plurality of mapping tables 372 stored in memory 345. According to these aspects of this disclosure, each of the plurality of mapping tables 372 may define a relationship between the code number cn and the run syntax element. In contrast, the plurality of mapping tables 372 described above with respect to other aspects of this disclosure may each define a relationship between the code number cn and both of the run syntax element and the level_ID syntax element.

Depending on a determined value of the code number cn, VLC decoding module 370 may access the selected mapping table using a first technique or a second technique. For example, if the code number cn has a first value (e.g., greater than a predetermined threshold), VLC decoding module 370 may access the selected mapping table using the first technique which includes using a first mathematical relationship to access the selected mapping table. However, if the code number cn has a second value different than the first value (e.g., less than or equal to the predetermined threshold), VLC decoding module 370 may access the selected mapping table using a second technique that includes using a second mathematical relationship. Once VLC decoding module 370 has determined the values of the level_ID and run syntax elements based on one of first technique or the second technique, video decoder 350 may use the determined level_ID and run values to decode the block of video data.

As described above, VLC decoding module 370 may access VLC tables 374 and/or mapping tables 372 to map a VLC codeword and/or a code number cn to at least one value (e.g., associated with at least one syntax element). VLC tables 374 and mapping tables 372 are illustrated as part of entropy decoding module 344 insofar as VLC decoding module 370 applies the respective tables. The VLC tables 372 and mapping tables 374, however, may actually be stored in a memory location, such as memory 345, which may be accessible by VLC decoding module 370 to apply the tables.

As depicted in FIG. 3, video decoder includes a filter module 349. Filter module 349 may perform in-loop or post loop filtering on reconstructed video blocks. Video decoder 350 also includes a prediction module 340, an inverse quantization unit 343, an inverse transform module 342, a memory 345, and a summer 346.

A wide variety of video compression technologies and standards perform spatial and temporal prediction to reduce or remove the redundancy inherent in input video signals. As explained above, an input video block is predicted using spatial prediction (i.e., intra prediction) and/or temporal prediction (i.e., inter prediction or motion estimation). The prediction modules described herein may include a mode decision module (not shown) in order to choose a desirable prediction mode for a given input video block. Mode selection may consider a variety of factors such as whether the block is intra or inter coded, the prediction block size and the prediction mode if intra coding is used, and the motion partition size and motion vectors used if inter coding is used. A prediction block is subtracted from the input video block, and transform and quantization are then applied on the residual video block as described above.

The quantized coefficients, along with the mode information, may be entropy encoded to form a video bitstream. The quantized coefficients may also be inverse quantized and inverse transformed to form the reconstructed residual block, which can be added back to the prediction video block (intra predicted block or motion compensated block depending on the coding mode chosen) to form the reconstructed video block. An in-loop or post-loop filter may be applied to reduce the visual artifacts in the reconstructed video signal. The reconstructed video block is finally stored in the reference frame buffer (i.e., memory) for use of coding of future video blocks.

In some examples, the transform coefficient encoding techniques described in this disclosure may be performed by VLC encoding module 260 of FIG. 2 by using VLC tables 264 and/or mapping tables 262. Again, although VLC tables 264 and mapping tables 262 are illustrated within entropy coding module 244, VLC tables 274 and/or mapping tables 272 may actually be stored in a memory location (such as memory 245) and accessed by VLC encoding module 272 in the coding process. The reciprocal transform coefficient decoding techniques of this disclosure may be performed by VLC decoding module 370 of FIG. 3 by applying VLC tables 374 and/or mapping tables 372. As with VLC module 260, with VLC module 370, VLC tables 374 and mapping tables 372 are illustrated within entropy decoding module 344. This illustration, however, is for demonstrative purposes. In actuality, VLC tables 374 and/or mapping tables 372 may be stored in a memory location (such as memory 345) and accessed by VLC module 370 in the decoding process. The term "coding," as used herein, refers to any process that includes encoding, decoding or both encoding and decoding.

Figure 4:
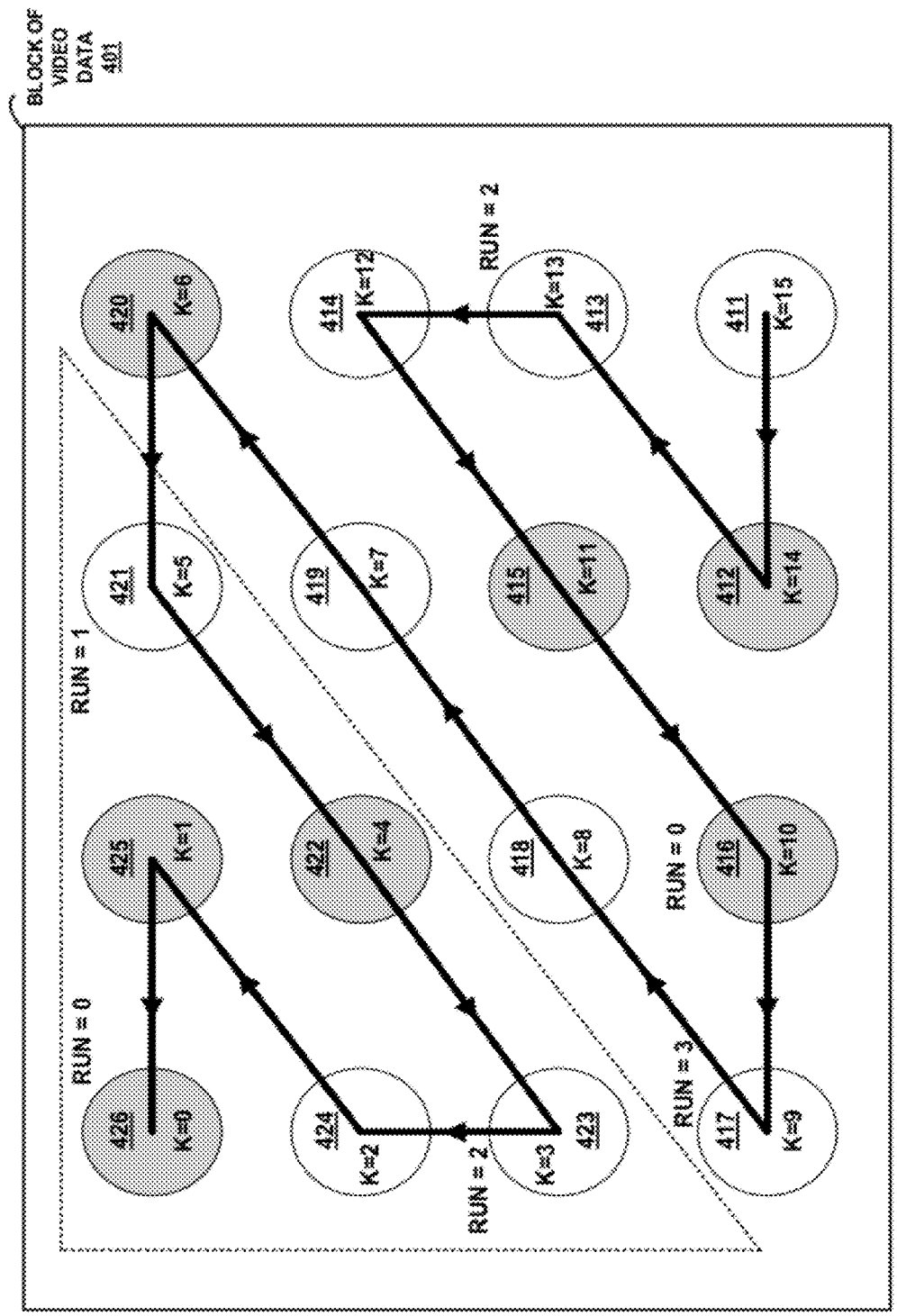
FIG. 4 is a conceptual diagram that illustrates one example of an inverse zig-zag scan of transform coefficients of a video block consistent with the techniques of this disclosure.

FIG. 4 is a conceptual diagram that illustrates one example of an inverse zig-zag scan consistent with the techniques of this disclosure. The example depicted in FIG. 4 is of a 4×4 block of video data. This example is provided for purposes of explaining the techniques of this disclosure, and is intended to be non-limiting. The techniques described herein may be applicable to any size of video block. For example, the techniques described herein may be applicable to 16×16, 32×32, 64×64, or any other size of block. Furthermore the techniques of this disclosure may be applied to a video block according to any arrangement of video data, including coded units defined according to a quadtree structure, macroblocks, or other blocks of video data. The techniques generally apply to block of data (i.e., transform coefficients) in the transform domain.

As depicted in FIG. 4, block 401 includes sixteen transform coefficients 411-426. According to this example, transform coefficients 411-426 are scanned starting at transform coefficient 411 positioned at a lower right corner of block 401. The inverse zig-zag scan depicted used to generate a one-dimensional ordered coefficient vector of transform coefficients, which may then be transmitted according to an entropy encoded bitstream.

According to the example of FIG. 4, block 401 includes both non-zero and zero magnitude coefficients 411-426. A non-zero coefficient may refer to a quantized transform coefficient with a magnitude greater than zero (e.g., |level| is greater than zero), while a zero value coefficient may refer to a transform coefficient with a quantized value equal to zero (e.g., |level| is equal to zero). For example as shown in FIG. 4, transform coefficients 412, 415, 416, 420, 422, 425, and 426 (as indicated by shading) are non-zero coefficients, while transform coefficients 411, 413, 414, 417-419, 423, and 424 are zero value transform coefficients.

As described above, an encoder may signal a level_ID value for at least some of transform coefficients 411-426. The level_ID value may indicate a magnitude of the respective transform coefficient. For example level_ID may have a value of zero (0) if a magnitude (|level|) of a coefficient is equal to one. According to this example, level_ID may have a value of one (1) if the magnitude of the coefficient is greater than one. In some examples, an encoder may not signal a level_ID value for zero value coefficients 411, 413, 414, 417-419, 423, and 424. Instead, run values associated with each significant (non-zero) coefficient may define the presence of previously scanned zero value coefficients.

As also described above, an encoder may determine a run value for at least some of transform coefficients 411-426. The run value may indicate a number of quantized coefficients with an magnitude equal to zero between a current (currently coded) coefficient and a next non-zero coefficient in an inverse zig-zag scan order. According to one example, run may have a value in a range from zero to k+1, wherein k is a position index value of the current coefficient in a scan. Position k may also be described to as a number of coefficients between a current coefficient and a last coefficient in scan order. Such a last coefficient may comprise a last coefficient in inverse zig-zag scan order (e.g., coefficient 426 in the example of FIG. 4). In some examples, an encoder may determine a run value for each non-zero coefficient of block 401.

FIG. 4 depicts run values that may be signaled after each of non-zero transform coefficients 412, 415, 416, 420, 422, 425, and 426 are coded. For example, as shown in FIG. 4, after transform coefficient 412 is coded, an encoder may signal a run value of run=2, meaning there are two zero value transform coefficients (413, 414) between transform coefficient 412 and a next non-zero coefficient (coefficient 415). As also shown in FIG. 4, after coefficient 415 is coded, an encoder may signal a run value of run=0, indicating that there are no zero value coefficients between coefficient 415 and the next non-zero coefficient in the scan order (coefficient 416). As also shown in FIG. 4, after coefficient 416 is coded, an encoder may signal a run value of run=3, indicating that there are three zero value coefficients (417-419) between transform coefficient 416 and a next non-zero coefficient (coefficient 420). As also depicted in FIG. 4, after coefficient 420 is coded, an encoder may signal a run value of run=1, indicating that there is one zero value coefficient (coefficient 421) between coefficient 420 a next non-zero coefficient (coefficient 422). As also depicted in FIG. 4, after coefficient 422 is coded, an encoder may signal a run value run=2, indicating that there are two zero value coefficients (coefficients 423-424) between coefficient 422 and a next non-zero coefficient (coefficient 425). As also depicted in FIG. 4, after coefficient 425 is coded, an encoder may signal a run value of run=0, indicating that there are no zero value coefficients between coefficients 425 and 426 in the scan order.

According to a run coding mode, an encoder (e.g., encoder 250) may determine values for run and level_ID associated with a transform coefficient (e.g., one or more coefficients 411-426) of a block 401 of video data, and signal the determined run and level_ID values as a VLC code word. A decoder (e.g., decoder 350) may receive the VLC code word, and use the VLC code word to determine the signaled values for run and level_ID. The decoder may use the determined run and level_ID values to decode the transform coefficient.

According to the example of FIG. 4, after coefficient 412 is coded, coefficient 413 becomes the current coefficient. A run value run=2 and a level_ID value with respect to coefficient 415 may be signaled (e.g., jointly coded, such as using a concatenated value), based on the position index value k (which is equal to 13 in the example of FIG. 4) for coefficient 413 i. After coefficient 415 has been coded, coefficient 416 becomes the current coefficient. A run value of 0 and the level_ID value of coefficient 416 may be signaled (e.g., jointly), based on the position index value k (equal to 10 in the example of FIG. 4) of coefficient 416. After coefficient 416 has been coded, coefficient 417 becomes the current coefficient, a run value of 3 and the level_ID value of coefficient 420 may be signaled (e.g., jointly), based on the position index value (equal to 6 in the example of FIG. 4) of coefficient 420 in the scan. In some examples, the coder may continue to determine and signal run and level_ID values with respect to coefficients 421-426, until coefficient 426 is coded.

To signal determined run and level_ID values as a VLC code word, the encoder maps the determined run and level_ID associated with the transform coefficient to a code number cn. The code number cn may then be used to access at least one VLC table to determine a VLC code word that represents the determined run and level_ID.

To use the VLC code word to determine the signaled run and level_ID values associated with a transform coefficient, a decoder determines a code number cn based on a received VLC code word, and maps the code number cn to run and level_ID values associated with the transform coefficient. The decoder may then use the mapped run and level_ID values to decode the transform coefficient.

As indicated by the dashed line surrounding coefficients 421-426, according to some aspects of this disclosure, a coder (e.g., an encoder or decoder) may map between code numbers cn and run and level_ID values for different transform coefficient of video block 401 using different techniques. According to the example depicted in FIG. 4, a coder may utilize a first technique (e.g., a structured mapping) to code coefficients 411-420, and use a second technique (e.g., accessing a mapping table of a plurality of mapping tables stored in memory) to code coefficients 421-426. According to this example, the first technique includes mapping using a structured mapping (e.g., a mathematical relationship). According to the first technique, the coder may not use any mapping tables previously stored in a memory accessible by the coder. Also according to this example, the second technique includes mapping based on one or more mapping tables stored in the memory accessible by the coder. According to the techniques described herein, a coding efficiency may be improved for blocks of any size of video data, including larger blocks of video data than depicted in FIG. 4. For example the techniques of this disclosure may improve coding efficiency for 8×8, 16×16, 32×32, or 64×64 sized blocks of video data.

The example of FIG. 4 depicts mapping between a code number cn and at least one value (e.g., a level_ID syntax element and/or a run syntax element) for a first number of coefficients (e.g., coefficients 421-426), and mapping based on accessing a mapping table of a plurality of mapping tables stored in memory for a second number of coefficients. As described above, according to other aspects of this disclosure, a coder may map between a code number cn and a level_ID syntax element and a run syntax using a first technique or a second technique, depending on a value of one of the code number cn or the level_ID syntax element.

In some examples, one or more of the different mapping techniques described herein may be used in combination with other mapping techniques described herein to code a block of video data. For example, a coder may map based on a structured mapping for a first number of coefficients of a block of video data, and map based on accessing a mapping table of a plurality of mapping tables stored in memory that each define a relationship between the code number cn and both of the level_ID and run syntax elements. According to another example, the coder may map based on the structured mapping for a first number of coefficients of a block of video data, and map based on accessing a selected mapping table using a first technique or a second technique depending on a value of one of the code number cn or the level_ID syntax element. According to this example, the plurality of mapping tables may define a relationship between the code number cn and only the run syntax element, in contrast with the plurality of mapping tables that each define a relationship between the code number cn and both the level_ID and run syntax elements. In still another example, a coder may map based on accessing a mapping table of a plurality of mapping tables stored in memory that each define a relationship between the code number cn and both of the level_ID and run syntax elements for a first number of coefficients of a block of video data, and map based on selectively using a first technique or a second technique to access a selected mapping table of a plurality of mapping tables (e.g., that define a relationship between the code number cn and only the run syntax element) depending on a value of the code number cn or the level_ID syntax element. In still another example, a coder may each of the three of the techniques described above, for different coefficients of a block of video data.

As described above, according to some techniques described herein, mapping (e.g., by an encoder or a decoder as described above) between a code number cn and at least one value associated with a transform coefficient (e.g., level_ID and/or run values) may include accessing a mapping table of a plurality of mapping tables stored in memory. According to these examples, the plurality of mapping tables may include a mapping table for each potential value of position k of transform coefficients. For example, according to block 401 depicted in FIG. 4, a 4×4 block of transform coefficients 411-426 includes sixteen possible positions k. As such, according to the example of FIG. 4, a plurality of mapping tables may include fifteen mapping tables that each specifies a mapping between code number cn and at least one syntax element (e.g., the run syntax element, or both the run and level_ID syntax elements) for each of respective position k, other than a first coefficient of the inverse zig-zag scan (e.g., coefficient 411 at position k=15).

In some examples, it may be undesirable to store a plurality of mapping tables for each potential value of coefficient position k for a block. For example, for larger block sizes (e.g., 16×16, 32×32, 64×64) it may be undesirable to store a mapping table for each coefficient position k of the larger size block. For example, for a 16×16 block, a coder may have access to 256 mapping tables for each position k of the block. For a 32×32 block, the coder may have access to 1024 mapping tables for each position k of the block. For a 64×64 block the coder may have access to 4096 mapping tables for each position k of the block. By using different techniques for different coefficient positions of a block as described herein, a number of mapping tables stored in a memory accessible by the coder may be reduced, which may improve a coding efficiency of the coder.

In some examples, instead of not using any mapping tables stored in memory (e.g., according to the structured mapping described above), according to other aspects of this disclosure a size of mapping tables stored in memory may be reduced in comparison to other techniques. For example, as described above, according to some aspects of this disclosure, a plurality of mapping tables stored in memory may each define a relationship between a code number cn and both level_ID and run syntax elements. According to other aspects of this disclosure, where a coder is configured to selectively use a first technique or a second technique based on a value of one of the code number cn or the level_ID syntax element, each of the plurality of mapping tables may define a relationship between the code number cn and only the run syntax element (e.g., not the level_ID syntax element). According to these aspects of this disclosure, a size of memory consumed to store mapping tables in memory may be reduced in comparison to other techniques.

Figure 5:
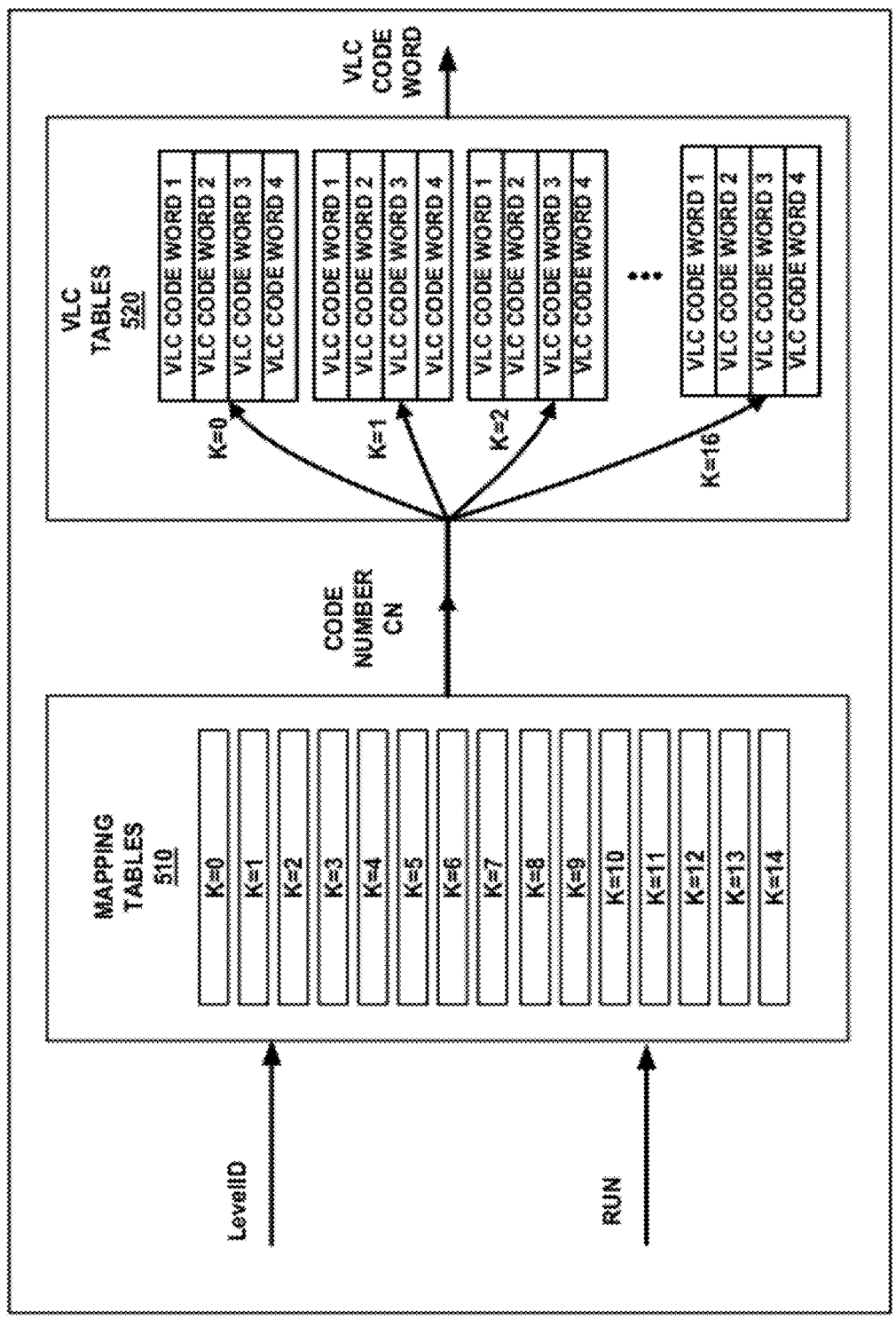
FIG. 5 is a conceptual diagram that illustrates one example of using a mapping table of a plurality of mapping tables stored in memory to encode transform coefficients of the block of video data consistent with the techniques of this disclosure.
Figure 10:
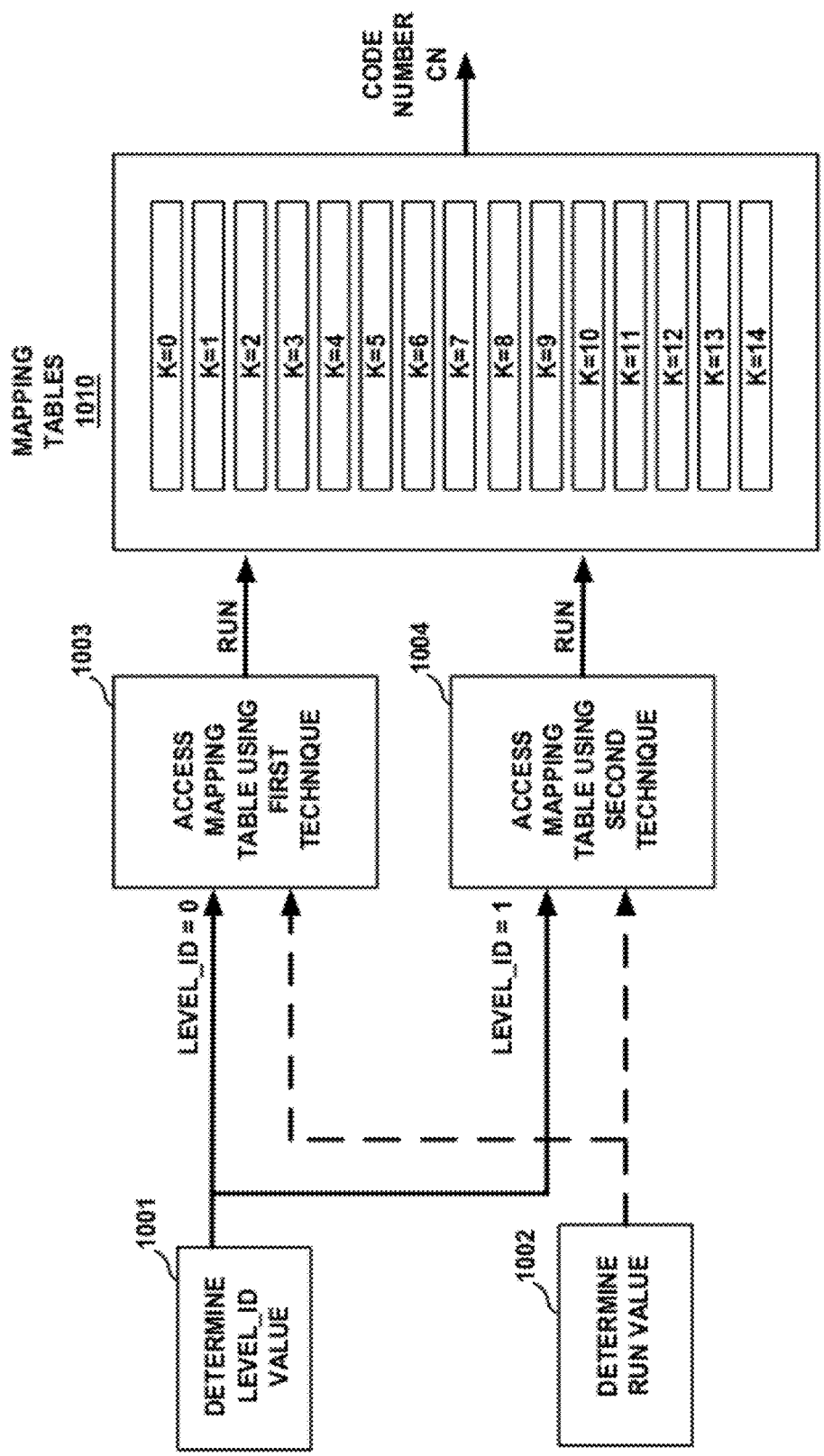
FIG. 10 is a conceptual diagram that illustrates one example of encoding a transform coefficient of a block of video data using a first technique or a second technique based on a value of a code number cn or a level_ID syntax element consistent with the techniques of this disclosure.

FIG. 5 is a conceptual diagram depicting one example of a technique for encoding transform coefficients of a block of video data consistent with the techniques of this disclosure. For exemplary purposes, the technique of FIG. 5 is described with reference to encoder 250 depicted in FIG. 2, however other devices may be used to perform the techniques depicted in FIG. 5. According to some aspects of this disclosure, encoder 250 may use at least one mapping table of a plurality of mapping tables 510 depicted in FIG. 5 to encode a first number of transform coefficients of a block of video data, and use a second, different technique to encode a second number of coefficients of the block of video data. In some examples, the second technique may be a structured mapping as described with respect to Example 1 below. According to other examples, the second technique may include selectively using a first technique or a second technique to access a mapping table of a plurality of mapping tables based on a determined value of a level_ID syntax element, as depicted in FIG. 10. According to these examples, such a plurality of mapping tables stored in memory may define a relationship between a run syntax element and a code number cn, unlike the plurality of mapping tables 510 depicted in FIG. 5, which each represent a relationship between both of the run and level_ID syntax elements and the code number cn.

As shown in FIG. 5, encoder 250 (e.g., entropy encoding module 244) may determine at least one value associated with a transform coefficient (e.g., level_ID and/or run values). In some examples, encoder 250 may determine the run and level_ID values associated with the transform coefficient as part of a scan of a plurality of coefficients of a block of video data. In some examples, the scan may comprise an inverse zig-zag scan as depicted and described with respect to FIG. 4. Also, in some examples, encoder 250 may be configured to switch between level and run mode encoding as also described above.

The level_ID value may indicate whether a next non-zero coefficient has an amplitude of one or greater than one. For example, to determine a level_ID value, encoder 250 may determine a magnitude of a non-zero transform coefficient. If the determined magnitude of the transform coefficient is equal to one, encoder 250 may determine a level_ID value of zero (0) for the transform coefficient. However, if the determined magnitude is greater than one, encoder 250 may determine a level_ID value of one (1) for the transform coefficient.

Encoder 250 may further determine a run value associated with the transform coefficient. The run value may indicate a number of quantized coefficients with an amplitude equal to zero between a current (currently coded) coefficient and a next non-zero coefficient in a scan order (e.g., an inverse zig-zag scan order). According to one example, run may have a value in a range from zero to k+1, where k is a position of the current coefficient in a scan. To determine a run value associated with a coefficient, encoder 250 may determine respective magnitudes of other coefficients of a video bock (e.g., other coefficients of block 401 depicted in FIG. 4). Encoder 250 may further identify a next non-zero coefficient (e.g., which of the quantized coefficients have a magnitude greater than zero) of the block. Encoder 250 may further determine a run value associated with the transform coefficient based on a number of zero value coefficients from a current coefficient to the identified next non-zero coefficient in the scan order. In some examples, encoder 250 may combine (e.g., concatenate) determined run and level_ID values into a single value. In some examples, such a single value may be referred to as an IsLevelOne_Run value.

Once the at least one value associated with the transform coefficient (e.g., values associated with level_ID and run syntax elements) has been determined, encoder 250 (e.g., VLC encoding module 260) may map the determined value(s) to a code number cn to determine the code number cn. According to one aspect of this disclosure, as depicted in FIG. 5, encoder 250 may map the determine values to a code number cn based on a mapping table of a plurality of mapping tables 510. Mapping tables 510 may be stored in a memory accessible by encoder 250, such as memory 245 depicted in FIG. 2. According to the example of FIG. 5, for a 4×4 block of video data as depicted in FIG. 4, mapping tables 510 include mapping tables for sixteen potential coefficient positions k from k=0 to k=15.

According to some examples, as described above, encoder 250 may store a mapping table dedicated to each potential value of coefficient position in a scan (e.g., each value of coefficient position k other than a first coefficient position of an inverse zig-zag scan). For example, for a block size of 4×4, encoder 250 may store fifteen mapping tables, for a block size of 8×8 an encoder may store 63 mapping tables, for a block size of 16×16, an encoder may store 255 mapping tables.

According to some aspects of this disclosure, a coder may be configured to transition between using different techniques for mapping at least one value (e.g., a level_ID syntax element and/or run syntax element) to a code number cn differently for different coefficients of a block of video data. According to these aspects of this disclosure, encoder 250 may store less mapping tables 510 than a number of potential positions k within a block of video data being encoded (e.g., less than fifteen mapping tables for a 4×4 block as depicted in the example of FIG. 4). Instead, the coder may only store mapping tables for a smaller number of coefficients of the block. For example, consistent with the techniques described herein, encoder 250 may use a structured mapping to map determined values to code numbers cn for a first number of coefficients of the block of video data with greater than sixteen transform coefficients (e.g., an 8×8, 16×16, 32×32, or 64×64 size block of video data). For a second number of coefficients of the block (e.g., a last 16 coefficients in a scan), encoder 250 may use the sixteen mapping tables 510 depicted in FIG. 5 to map determined values to code numbers cn. According to this example, encoder 250 may avoid using mapping tables 510 to map at least one value associated with a transform coefficient to a code number cn for a first coefficient (or first number of coefficients) of a block.

For example, for an 8×8 block, which includes 64 coefficients, encoder 250 may use a structured mapping (e.g., a mathematical relationship) to map at least one value (e.g., level_ID and/or run values) to code numbers cn for a first 52 coefficient positions of the 8×8 block. For the second number of coefficient positions of the 8×8 block (e.g., a remaining 16 coefficient positions), encoder 250 may access mapping tables 510 stored in memory (e.g., memory 245 depicted in FIG. 2). As another example, for a 16×16 block, encoder 250 may use a structured mapping (e.g., a mathematical relationship) to map run and level_ID values to code numbers cn for a first 240 coefficient positions of the 16×16 block. For the second number of coefficient positions of the 16×16 block (e.g., a remaining sixteen coefficient positions), encoder 250 may access mapping tables 510 stored in memory (e.g., memory 245 depicted in FIG. 2).

According to some examples, encoder 250 may selectively apply a first technique or a second technique to map run and level_ID values to a code number cn based on comparing a position k of a coefficient to a predetermined threshold T. For example, according to the example depicted in FIG. 5, the predetermined threshold may have a value of 15. According to this example, as encoder 250 performs a scan of transform coefficients, encoder 250 may compare a position k of each transform coefficient to the threshold T. If a position k of the transform coefficient is greater than the threshold T (e.g., greater than 15 in the example of FIG. 5), then encoder 250 may apply the first technique described above, and map the at least one value (e.g., level_ID and/or run values) to a code number cn based on a mathematical relationship. However, if the position k is less than or equal to the threshold T, encoder 250 may access one of mapping tables 510 stored in memory 245 to map the at least one value to a code number cn.

By switching between first and second techniques for values (e.g., level_ID and/or run values) associated with transform coefficients to code numbers cn as described herein, encoder 250 may reduce a number of mapping tables 510 stored in a memory accessible by encoder 250 (e.g., memory 245). According to these techniques, a number of mapping tables stored by encoder 250 may be less than a number of coefficient positions of a scan. For example, for a 16×16 block, which includes up to 256 positions k, only a number of (e.g., T+1) mapping tables may be stored. Similarly, for any size block of video data, encoder 250 may store a number of mapping tables less than a number of coefficient positions within the block, and thereby reduce an amount of stored data used to encode the block. Accordingly, memory otherwise used to store mapping tables 510 may be used for other purposes, thereby improving coding efficiency.

In some examples, mapping a value associated with a transform coefficient to a code number cn according to the second technique (e.g., using one or more mapping tables) may be more accurate than according to the first technique (e.g., a structured mapping) as described herein. However, mapping according to the second technique may also require more memory to store a plurality of mapping tables. In some examples consistent with the techniques described herein, a threshold T as described above may be selected based on a desired balance between accuracy (e.g., coding quality), and memory usage. For example, the threshold T may be determined based on one or more of a size of a block being coded, a quality and/or complexity of video content being coded, and an amount available processing and/or communications capability of a coder performing the coding.

As also depicted in FIG. 5, encoder 250 may have access to a plurality of VLC tables 520 which, like mapping tables 510, may be stored in a memory accessible by encoder 250. As depicted in FIG. 5, VLC tables 520 include a plurality of VLC tables each dedicated to coefficient positions k of a scan up to a number N, which represents a size of a video block being encoded. For example, according to the 4×4 video block 401 depicted in FIG. 4, VLC tables 520 may include fifteen VLC tables, each dedicated to the fifteen potential coefficient positions in video block 401 (e.g., except for a first coefficient of an inverse zig-zag scan). In some examples, a number of VLC tables 520 may depend on a size of a block of video data. For example, for an 8×8 block, VLC tables 520 may include 64 VLC tables. As another example, for a 16×16 video block VLC tables 520 may include 256 tables. In other examples, video encoder 250 may include more or fewer VLC tables 520 than potential coefficient positions within a block of video data.

Each of the VLC tables depicted in FIG. 5 includes four code words (VLC code word 1, VLC code word 2, VLC code word 3, VLC code word 4). In other examples, VLC tables may include more, or fewer, VLC code words. The respective code words may be different between the tables. For example, VLC code word 1 of the VLC table dedicated to a position k=1 may be a different VLC code word than VLC code word 1 of the VLC table dedicated to a position k=2.

Once encoder 250 (e.g., VLC encoding module 260) determines a code number cn, encoder 250 may use the code number to access one of VLC tables 520 to determine a VLC code word that represents determined values of at least one value (e.g., level_ID and/or run values). For example, according to the example of FIG. 5, a code number cn may have a value of three. The code number value of three may indicate that, for each of the depicted VLC tables (k=1, k=2, k=3, k=4), a VLC code word corresponding to a fourth position within the respective table. Encoder 250 may select a VLC table of VLC tables 520 based on a position k of a current transform coefficient, and based on a determined code number cn, determine a VLC code word that represents at least one value (e.g., level_ID and/or run syntax elements) associated with a transform coefficient. Encoder 250 may signal the determined VLC code word to a decoder, such as decoder 350. For example, encoder 250 may signal the determined VLC code word as part of an entropy encoded bit stream of video data.

Figure 6:
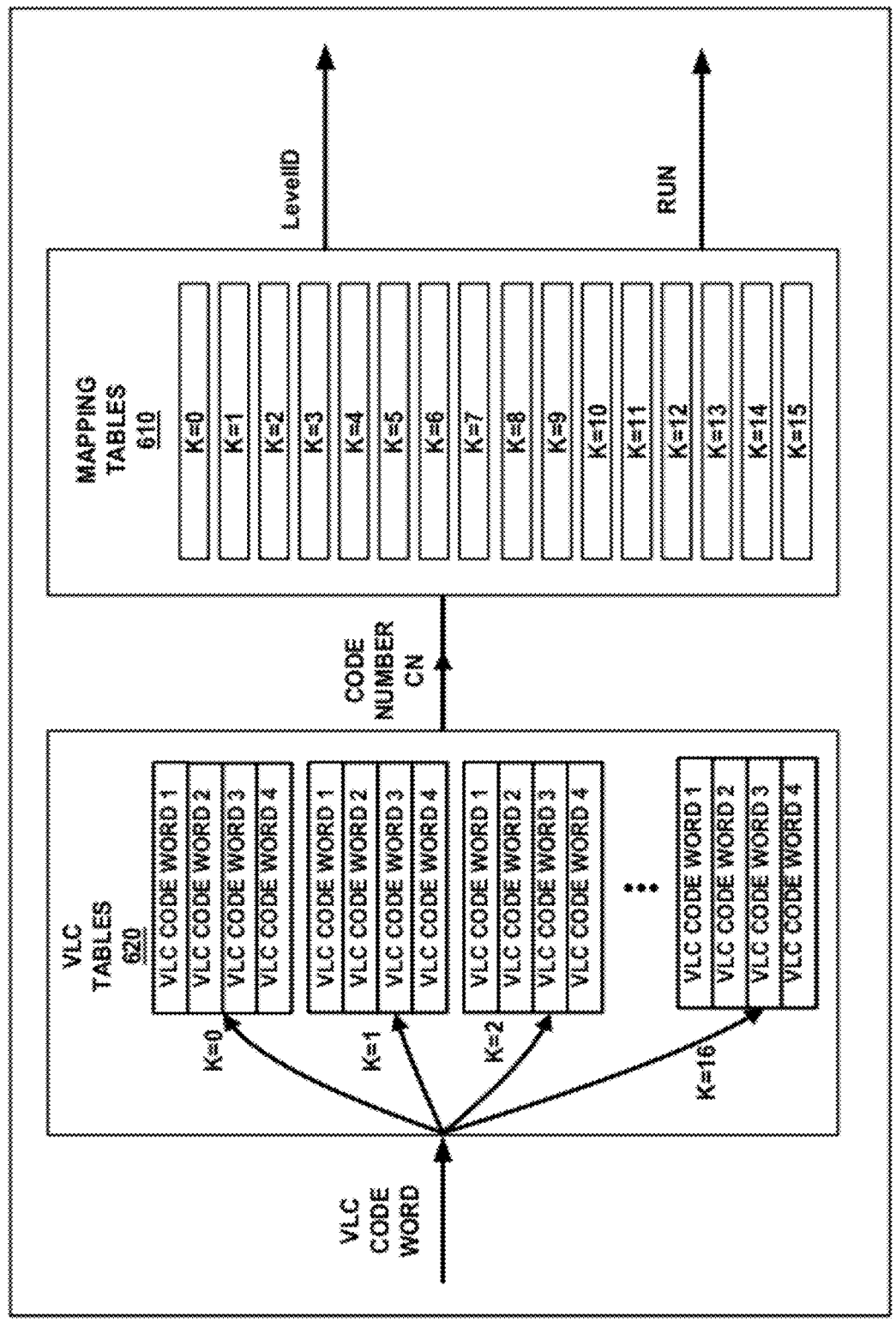
FIG. 6 is a conceptual diagram that illustrates one example using a mapping table of a plurality of mapping tables stored in memory to decode transform coefficients of the block of video data consistent with the techniques of this disclosure.

FIG. 6 is a conceptual diagram depicting one example of a technique for decoding transform coefficients of a block of video data consistent with the techniques of this disclosure. For exemplary purposes, the techniques of FIG. 6 are described with reference to decoder 350 depicted in FIG. 3, however any decoding device may be used to perform the techniques depicted in FIG. 6. According to some aspects of this disclosure, decoder 350 may use at least one mapping table of a plurality of mapping tables 610 depicted in FIG. 6 to decode a first number of transform coefficients of a block of video data, and use a second, different technique to decode a second number of coefficients of the block of video data. In some examples, the second technique may be a structured mapping as described with respect to Example 2 below. According to other examples, the second technique may include selectively using a first mathematical relationship or a second mathematical relationship to access a mapping table of a plurality of mapping tables based on a determined value of a level_ID syntax element. According to these examples, such a plurality of mapping tables stored in memory may define a relationship between a run syntax element and a code number cn, unlike the plurality of mapping tables 610 depicted in FIG. 6, which each represent a relationship between the code number cn and both of the run and level_ID syntax elements.

According to the example of FIG. 6 decoder 350 (e.g., VLC decoding module 370) determines at least one value (e.g., level_ID and/or run values) based on a received VLC code word. As depicted in FIG. 6, like encoder 250, decoder 350 includes a plurality of mapping tables 610 and a plurality of VLC tables 620. In some examples, mapping tables 610 and VLC tables 620 of decoder 350 are substantially the same tables as mapping tables 510 and VLC tables 520 of encoder 250, respectively.

As shown in FIG. 6, decoder 350 may receive a VLC codeword from an encoder 250. The decoder 350 has access to VLC tables 620, each dedicated to a particular position k of a currently coded coefficient up to a number N, which corresponds to a size of a block of video data being decoded. For example, for a 4×4 block, N equals 16. For an 8×8 block, N equals 64. For a 16×16 block, N equals 256. Based on determining position k of a current coefficient, decoder 350 may select a VLC table, and use the VLC table to determine a code number cn associated with the received VLC code word. Decoder 350 may map the determined code number cn to at least one value associated with a current coefficient (e.g., level_ID and/or run values).

Figure 11:
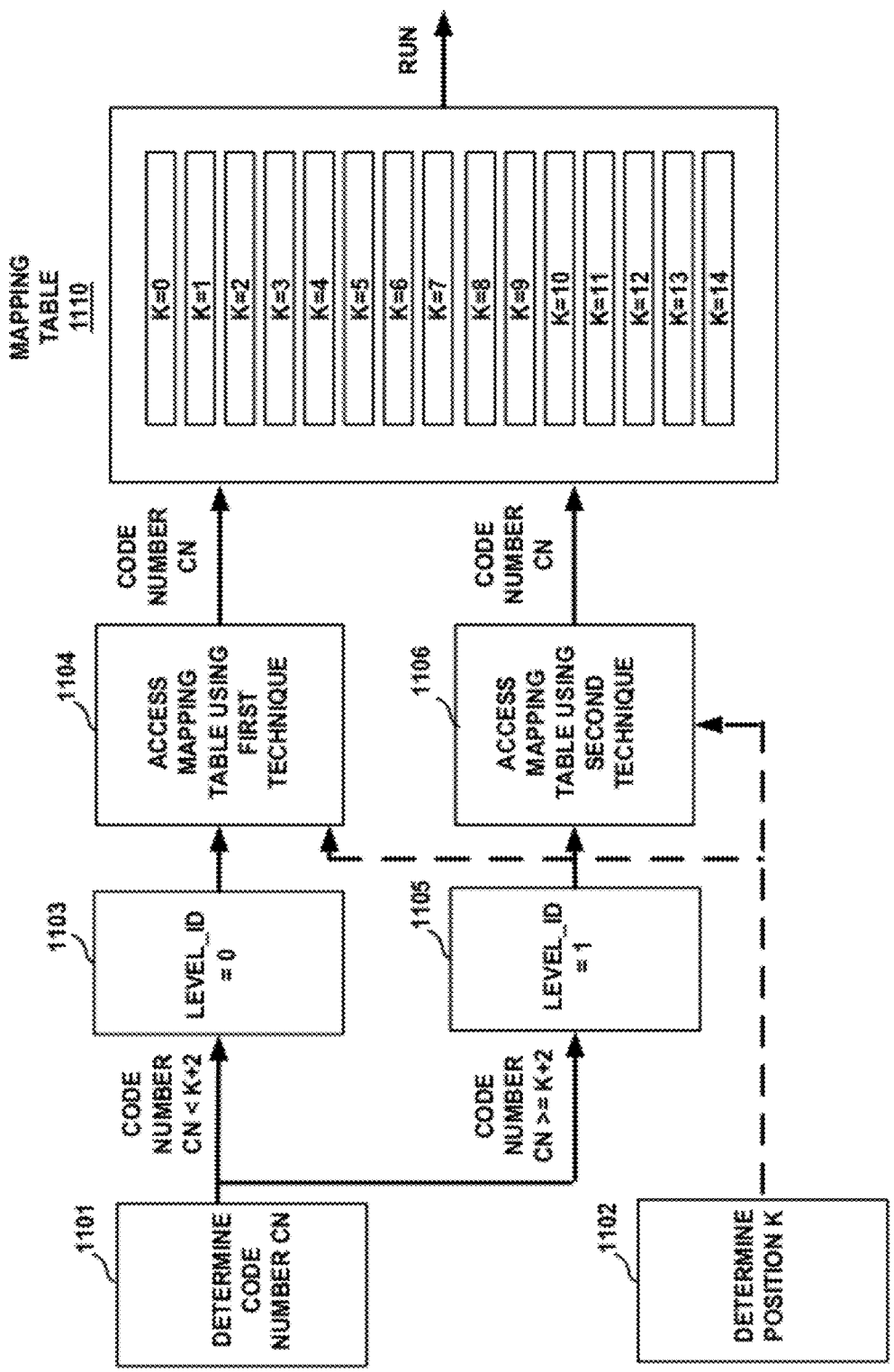
FIG. 11 is a conceptual diagram that illustrates one example of encoding a transform coefficient of a block of video data using a first technique or a second technique based on a value of a code number cn or a level_ID syntax element consistent with the techniques of this disclosure.

As depicted in FIG. 6, decoder 350 may have access to mapping tables 610. For example, mapping tables 610 may be stored in memory 345 accessible by decoder 350. As described above with respect to mapping tables 510 depicted in FIG. 5, mapping tables 610 may include less mapping tables than a number of potential coefficient positions of a block (e.g., less than a number N of coefficient positions of a block). According to the techniques of this disclosure, decoder 350 may map code numbers cn to at least one value (e.g., level_ID and/or run values) associated with a first coefficients (or a first plurality of coefficients) of a block using a first technique, and map code numbers cn to at least one value associated with a second coefficient (or a second plurality of coefficients) of the block using a second technique different than the first. For example, the first technique may include using a structured mapping (e.g., mathematical relationship) to map a first code numbers cn to at least one value associated with a first transform coefficient of the block. The second technique may include accessing mapping tables 610 stored in a memory accessible by decoder 350 to map a second code number cn to at least one value associated with a second transform coefficient of the block. In some examples, mapping tables 610 may each define a relationship between the code number cn and both of run and level_ID syntax elements. For example, as shown in FIG. 6, each of mapping tables 610 of decoder 350 may receive as input a code number cn, and output both of the run syntax element and the level_ID syntax element. According to other examples, the second technique may include accessing a mapping table of mapping tables 1110 using a first mathematical relationship or a second mathematical relationship as depicted in FIG. 11. As shown in FIG. 11, mapping tables 1110 may each define a relationship between the code number cn and the run syntax element.

According to some examples, decoder 350 may selectively apply a first technique or a second technique to map a code number cn to at least one value based on comparing a position k of a coefficient to a predetermined threshold T. For example, according to the example depicted in FIG. 6, the predetermined threshold T may have a value of fifteen. According to this example, as decoder 250 performs a scan of transform coefficients, decoder 350 may compare a position k of each transform coefficient to the threshold T. If a position k of the transform coefficient is greater than the threshold T (e.g., greater than sixteen in the example of FIG. 6), decoder 350 may apply the first technique described above, and map a code number cn to at least one value (e.g., level_ID and/or run values) associated with the transform coefficient. However, if the position k is less than or equal to the threshold T, decoder 350 may apply the second technique and access one of mapping tables 610 stored in memory to map a code number cn to the at least one value associated with the transform coefficient. In other examples, if the position k is less than or equal to the threshold T, decoder 350 apply the second technique which includes selectively using a first or second mathematical relationship to access at least one mapping table stored in memory, as depicted in FIG. 11.

By switching between first and second techniques for mapping code numbers cn to at least one value to as described herein, a number of mapping tables 610 stored in a memory accessible by decoder 350 (e.g., stored in memory 345) may be reduced. According to these techniques, for a 16×16 block, which includes up to 256 positions k, fewer than 255 (e.g., (T+1) tables) mapping tables may be stored. Similarly, for any size block of video data, decoder 350 may store a number of mapping tables less than a number of coefficient positions within the block, and thereby reduce an amount of stored data used to decode the block. Accordingly, memory otherwise used to store mapping tables 610 may be used for other purposes, thereby improving coding efficiency.

As described above, this disclosure explains coding techniques that include switching between first and second techniques for mapping between a code number cn and at least one value for different transform coefficients of a block of video data. As also described above, this disclosure explains techniques for switching between a first technique that include performing such a mapping based on a structured mapping (e.g., a mathematical relationship), and a second technique that includes performing such a mapping based on one or more mapping tables stored in memory. In some examples, the coder may switch between the first and second techniques based on comparison of a position k of a transform coefficient to a predetermined threshold.

Example 1 below illustrates one example of pseudo code that may be used by an encoder 250 to implement a structured mapping according to the first technique described herein:

Example 1

```
if (level_ID==0){
    cn=run;
}
else {
    cn = k + run + 2;
}
```

This pseudo code of Example 1 may be stored in memory (e.g., memory 245) of the encoder so that the encoder is able to perform a structured mapping when needed.

The pseudo code of Example 1 may operate to map between a code number cn and run and level_ID based on determined values of one or more of position k, level_ID, and run values. For example, according to the above pseudo code, if a level_ID value of a transform coefficient has a value equal to zero, (e.g., indicating that the next non-zero coefficient has a magnitude equal to one), an encoder (e.g., encoder 250) may assign a code number cn a value that is equal to the value of run. In other words, the code number cn may be assigned a value that corresponds to a number of zero coefficients between the current coefficient and a next non-zero coefficient in scan order (e.g. an inverse zigzag scan order as depicted in FIG. 4).

Also according to the pseudo code of Example 1, if a value of a level_ID value of a transform coefficient is not equal to zero (e.g., equal to one), an encoder may assign a code number cn a value of k, plus a determined value of run associated with the coefficient, plus two.

The pseudo code depicts a structured mapping of run and level_ID values associated with a transform coefficient to a code number cn. Operation of the above pseudo code is based on known input values of run, level_ID, and position k. As such, an encoder 250 may determine values of run and level_ID, and apply the pseudo code described above to directly determine a code number cn. For a decoder, however, values of run and level_ID are not known. Instead, the decoder receives a VLC code word, and uses a VLC table to determine a code number, and maps the code number to run and level_ID values. In some examples, a decoder may have access to reciprocal pseudo code that defines a mapping from a determined code number cn and/or position k to run and level_ID.

Example 2 below illustrates one example of pseudo code that may be used by a decoder 350 to implement a structured mapping according to the first technique described herein:

Example 2

```
if (cn < k+2){
    level_ID = 0;
    run = cn;
}
else {
    level_ID = 1;
    run = cn - k - 2;
}
```

This pseudo code may be stored in memory (e.g., memory 345) of the decoder so that the decoder is able to perform a structured mapping when needed.

The pseudo code of Example 2 may operate to map from a code number cn to run and level_ID based on determined values of one or more of position k, and a determined code number cn. For example, according to the above pseudo code, if a code number cn has a value less than a position k plus 2, an decoder (e.g., decoder 350) may assign level_ID a value of zero, and run a value of the code number cn. However, if the code number cn is greater than or equal to the value k plus 2, the decoder may assign level_ID a value equal to one, and run a value of the code number cn minus position k, minus two.

The example pseudo code set forth in Examples 1 and 2 above are merely some examples of a structured mapping that may be used by a coder (e.g., encoder 250, decoder 350) consistent with the techniques of this disclosure. Any other form of structured mapping that allows a coder to transition between first and second techniques for mapping between at least one value associated with a transform coefficient (e.g., level_ID and/or run values) and a code number are consistent with the techniques described herein.

Figure 7:
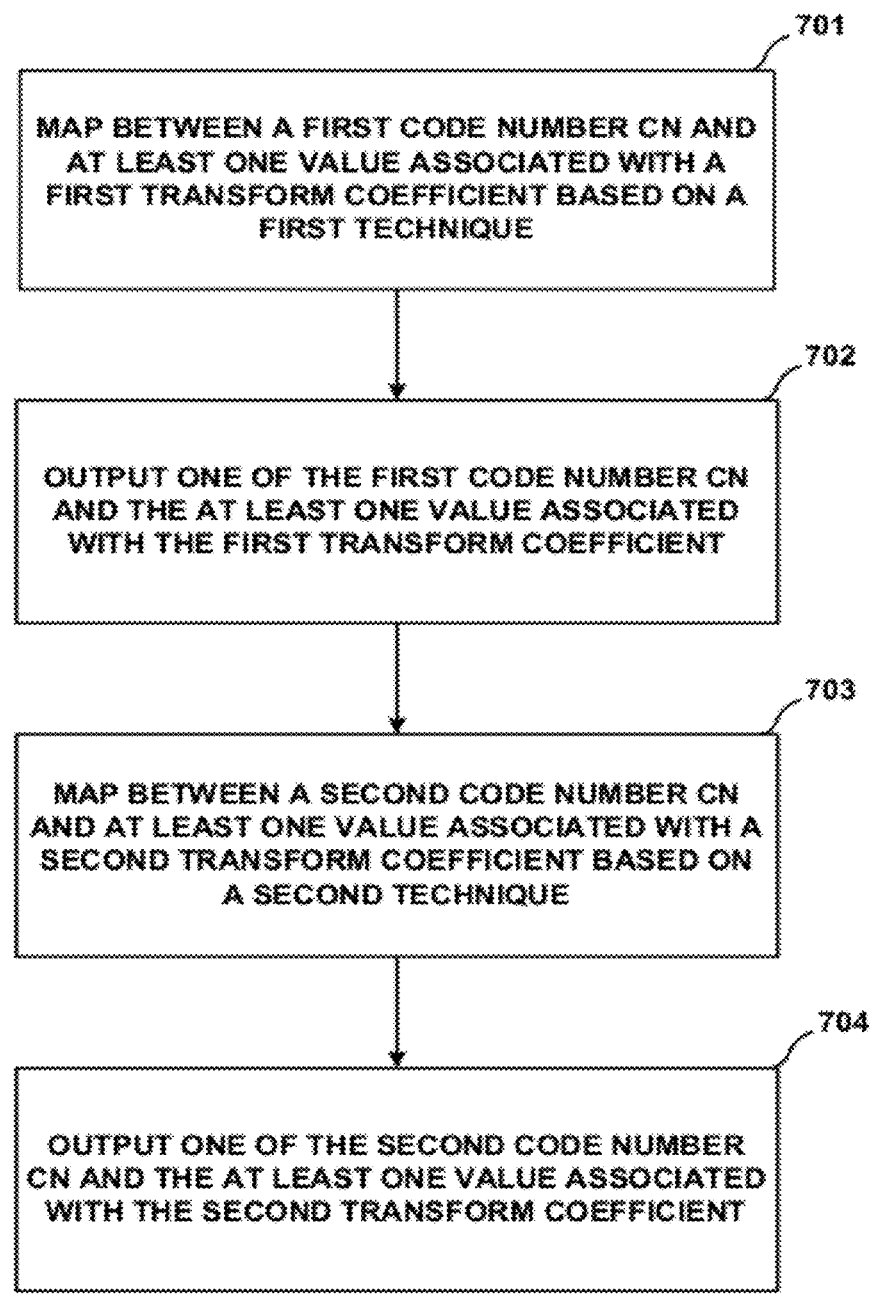
FIG. 7 is a flow diagram that illustrates one example of a method of coding a first number of transform coefficients of a block of video data using a first technique, and coding a second number of transform coefficients of the block of video data using a second technique consistent with the techniques of this disclosure.

FIG. 7 is a flow diagram that illustrates one example of a method of coding (e.g., encoding or decoding) transform coefficients of a block of video data consistent with the techniques of this disclosure. As depicted in FIG. 7, a coding module (e.g., video encoder 250 depicted in FIG. 2, video decoder 350 depicted in FIG. 3), may map between a first code number cn and at least one value (e.g., level_ID and/or run syntax elements) associated with a first current transform coefficient of the block of video data based on a first technique (701). The first technique may include performing a structured mapping. As also depicted in FIG. 7, the coding module may output one of the first code number cn or the at least one value associated with the first transform coefficient (702). For example, if the coding module comprises an encoding module, the encoding module may output the first code number cn (e.g., map the first code number to a VLC code word and output the VLC code word). As another example, if the coding module comprises a decoding module, the decoding module may output the at least one value associated with the first transform coefficient (e.g., use the at least one value to decode the block of video data).

As also depicted in FIG. 7, the coding module may map between a second code number cn and at least one value (e.g., level_ID and/or run syntax elements) associated with a second transform coefficient of the block of video data using a second technique different than the first technique (703). The second technique may include using at least one mapping table stored in a memory. The at least one value associated with the first transform coefficient and the at least one value associated with the second transform coefficient may comprise one or more of an level_ID and/or run syntax element associated with the respective first and second transform coefficients. The first code number cn may or may not be the same as the second code number cn. In one example, the second technique includes using at least one mapping table of a plurality of mapping tables that each define relationship between the code number cn and the level_ID and run syntax elements (e.g., mapping tables 510, 610 depicted in FIGS. 5 and 6). According to another example, the second technique includes using a first or second mathematical relationship to access at least one mapping table of a plurality of mapping tables that each define a relationship between the code number cn and only the run syntax element, (e.g., mapping tables 1010, 1110 depicted in FIGS. 10 and 11).

As also depicted in FIG. 7, the coding module may output one of the second code number cn and/or the at least one value associated with the second transform coefficient (704). For example, if the coding module comprises an encoding module, the encoding module may output the second code number cn (e.g., map the first code number to a VLC code word and output the VLC code word). As another example, if the coding module comprises a decoding module, the decoding module may output the at least one value associated with the second transform coefficient (e.g., use the at least one value to decode the block of video data).

According to one example, if the coding module comprises an encoding module (e.g., video encoder 250), the encoding module may determine the at least one value associated with the first transform coefficient, and determine the first code number cn based on mapping according to the first technique. The encoding module may further determine the at least one value associated with the second transform coefficient, and determine the second code number cn based mapping according to the second technique. The encoding module may use the determined first code number cn and/or the second code number cn to access one or more VLC tables to determine a first VLC code word that represents the at least one value associated with the first transform coefficient, and/or a second VLC code word that represents the at least one value associated with the second transform coefficient. The encoding module may output the first VLC code word and/or the second VLC code word to a decoding module (e.g., video decoder 350 depicted in FIG. 3). The decoding module may use the output first and/or second VLC code words to decode the block of video data.

According to another example, if the coding module comprises a decoding module (e.g., video decoder 350), the decoding module may receive a first VLC code word associated with the first transform coefficient, and/or a second VLC code word associated with the second transform coefficient. The decoding module may use the received first VLC code word to determine the first code number cn, and use the second VLC code word to determine the second code number cn.

The decoding module may use the determined first code number cn to determine the at least one value associated with the first transform coefficient based on the first technique that includes a structured mapping. The decoder may use the determined second code number cn to determine the at least one value associated with the second transform coefficient based on the second technique that includes accessing at least one mapping table stored in memory. The decoder may use the determined at least one value associated with the first transform coefficient and/or the determined at least one value associated with the second transform coefficient to decode the block of video data.

Figure 8:
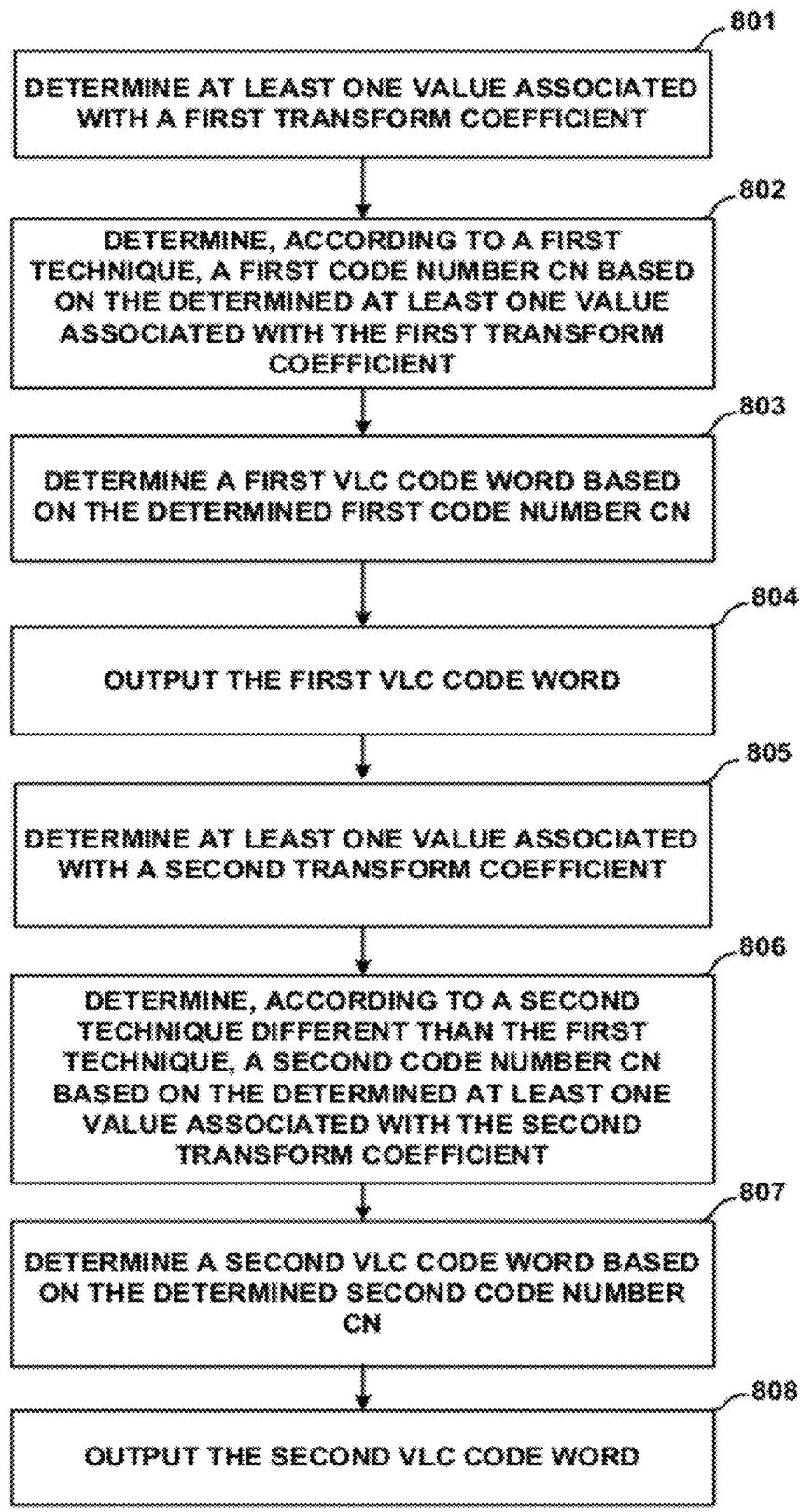
FIG. 8 is a flow diagram that illustrates one example of a method of encoding a first number of transform coefficients of a block of video data using a first technique, and encoding a second number of transform coefficients of the block of video data using a second technique consistent with the techniques of this disclosure.

FIG. 8 is a flow diagram that illustrates one example of a method of encoding a current transform coefficient of a block of video data. As depicted in FIG. 8, an entropy encoding module 244 determines at least one value (e.g., level_ID and/or run values) associated with a first transform coefficient of the block of video data (801). For example, the encoder may determine level_ID and run values associated with the first transform coefficient based on determining respective magnitudes of the current transform coefficient and/or other transform coefficients of the block of video data.

As also depicted in FIG. 8, entropy encoding module 244 may determine, according to a first technique, a first code number cn based on the determined at least one value associated with the first transform coefficient (802). The first technique may include mapping the determined at least one value associated with the first transform coefficient to the first code number cn according to a structured mapping (e.g., a mathematical relationship). According to one example, such a structured mapping may include using the pseudo code reproduced in Example 1.

As also depicted in FIG. 8, entropy encoding module 244 may determine a first VLC code word associated with the first code number cn to represent the at least one determined value (803). For example, entropy encoding module 244 may access a VLC table of a plurality of VLC tables (e.g., VLC tables 510 depicted in FIG. 5) to determine the first VLC code word. Entropy encoding module 244 may output the first VLC code word (804). For example, the encoder may output the first VLC code word to a decoder.

Entropy encoding module 244 may further determine at least one value associated with a second transform coefficient of the block of video data (805). For example, entropy encoding module 244 may determine level_ID and run values associated with the second transform coefficient based on determining respective magnitudes of the second transform coefficient and/or other transform coefficients of the block of video data.

As also depicted in FIG. 8, entropy encoding module 244 may determine a second code number cn for the second transform coefficient based on the determined at least one value associated with the second transform coefficient according to a second technique (806). According to one example, the second technique may include mapping the determined at least one value associated with the second transform coefficient to the second code number cn using a mapping table of a plurality of mapping tables stored in memory (e.g., memory 245 depicted in FIG. 2) that each define a relationship between both of the run syntax element and the level_ID syntax element and the code number cn (e.g., mapping tables 510 depicted in FIG. 5). According to another example, the second technique may include mapping using a first mathematical relationship or a second mathematical relationship to access a mapping table of a plurality of mapping tables that each define a relationship between only the run syntax element and the code number cn (e.g., mapping tables 1010 depicted in FIG. 10).

As also depicted in FIG. 8, entropy encoding module 244 may determine a second VLC code word associated with the second code number cn to represent the at least one determined value (807). As also depicted in FIG. 8, entropy encoding module 244 may output the second VLC code word (808). For example, entropy encoding module 244 may output the first VLC code word and/or the second VLC code word to a decoder as part of an entropy encoded bit stream.

Figure 9:
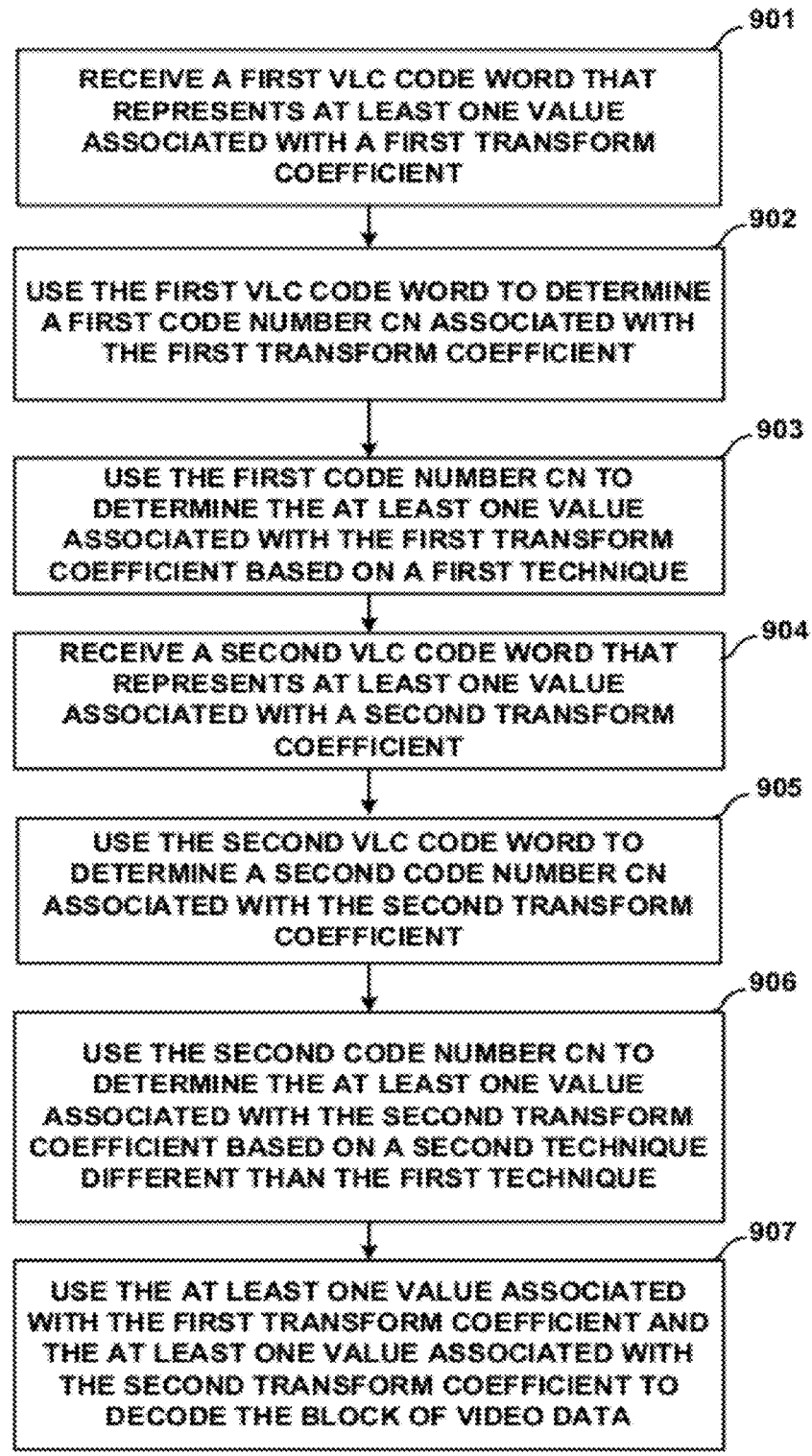
FIG. 9 is a flow diagram that illustrates one example of a method of a first number of transform coefficients of a block of video data using a first technique, and coding a second number of transform coefficients of the block of video data using a second technique consistent with the techniques of this disclosure.

FIG. 9 is a flow diagram that illustrates one example of a method of decoding a transform coefficients of a block of video data consistent with the techniques of this disclosure. As depicted in FIG. 9, entropy decoding module 344 may receive a first VLC code word that represents at least one value (e.g. level_ID and/or run syntax elements) associated with a first transform coefficient of a block of video data (901). As also depicted in FIG. 9, entropy decoding module 344 may use the first VLC code word to determine a first code number cn associated with the first transform coefficient (902).

As also depicted in FIG. 9, entropy decoding module 344 may use the determined first code number cn to determine the at least one value associated with the first transform coefficient according to a first technique (903). The first technique may include mapping the first code number cn to the at least one value associated with the first transform coefficient base on a structured mapping (e.g., mathematical relationship).

As also depicted in FIG. 9, entropy decoding module 344 may receive a second VLC code word that represents at least one value associated with a second transform coefficient of the block of video data (904). Entropy decoding module 344 may use the second VLC code word to determine a second code number cn associated with the second transform coefficient (905). For example, entropy decoding module 344 may determine the second code number cn based on accessing one or more VLC tables stored in memory.

As also depicted in FIG. 9, entropy decoding module 344 may use the determined second code number cn to determine the at least one value associated with the second transform coefficient according to a second technique (906). According to one example, the second technique may include accessing a mapping table of a plurality of mapping tables stored in a memory (e.g., memory 345) that each define a relationship between the code number cn and both of the level_ID and run syntax elements (e.g., mapping tables 610 depicted in FIG. 6). According to another example, the second technique may include accessing a mapping table of a plurality of mapping tables that each define a relationship between the code number cn and the run syntax element (e.g., mapping tables 1110 depicted in FIG. 11).

As also depicted in FIG. 9, entropy decoding module 344 may use the at least one value associated with the first transform coefficient and/or the at least one value associated with the second transform coefficient to decode the block of video data (907). For example, the at least one value associated with the first transform coefficient and/or the at least one value associated with the second transform coefficient may include level_ID and run values associated with the respective first and/or second transform coefficients. According to this example, entropy decoding module 344 may use the respective values to perform a scan of a plurality of transform coefficients of the block of video data according to a run decoding mode.

FIGS. 10 and 11 are flow diagrams that illustrate examples of mapping between a code number cn and level_ID and run syntax elements associated with a transform coefficient of a block of video data consistent with the techniques of this disclosure. According to the examples depicted in FIGS. 5 and 6, according to some aspects of this disclosure a coder may map between a code number cn and at least one value (e.g., a value associated with one or more of a level_ID syntax element and a run syntax element) associated with a transform coefficient of a block of video data based on accessing a mapping table of a plurality of mapping tables (e.g., mapping tables 510, 610) that each define a relationship between both level_ID and run syntax elements and a code number cn. As described with respect to Example 1 and Example 2, according to another aspects of this disclosure a coder may map between a code number cn and a level_ID value and a run value based on a structured mapping (e.g., a mathematical relationship). The structured mapping described with respect to Example 1 and Example 2 may improve coding efficiency, by reducing or eliminating a number of mapping tables stored in memory that are used to map between the code number cn and the level_ID value and the run value. FIGS. 7-9 illustrate example methods that include transitioning between technique for mapping based on a mapping table of a plurality of mapping tables 510, 610 illustrated in FIGS. 5 and 6, and the structured mapping described with respect to Example 1 and Example 2 above.

FIGS. 10 and 11 illustrate another technique according to other aspects of this disclosure, that may be used to improve coding efficiency by reducing a size of mapping tables stored in memory that are used to map between the code number cn and at least one syntax element (e.g., a level_ID syntax element and/or a run syntax element). According to these aspects, instead of accessing a mapping table of a plurality of mapping tables 510, 610 depicted in FIGS. 5 and 6, a coder (e.g., encoder, decoder) may map between a code number cn and at least one syntax element by using a first technique or a second technique to access a mapping table of a plurality of mapping tables 1110 that each define a relationship between the run syntax element and the code number cn. Because mapping tables 1010, 1110 only define the relationship between the run syntax element and the code number cn, mapping tables 1010, 1110 may consume less space in memory than mapping tables 510, 610 depicted in FIGS. 5 and 6.

According to the example of FIGS. 10 and 11, a coder may map between a code number cn and a level_ID syntax element and a run syntax element associated with a transform coefficient of a block of video data using a first technique or a second technique, based on a determined value of one of the code number cn and the level_ID syntax element. For example, the coder may access a selected mapping table of the plurality of mapping tables 1010, 1110 stored in memory differently, depending on the value of the code number cn or the at least one value associated with the transform coefficient.

FIG. 10 is a conceptual diagram that illustrates one example of mapping between a code number cn and level_ID and run syntax elements to encode at least one transform coefficient of a block of video data consistent with one or more aspects of this disclosure. The mapping depicted in FIG. 10 may be performed by video encoder 250 depicted in FIG. 2 (e.g., VLC encoding module 260 depicted in FIG. 2). According to the example of FIG. 10, video encoder 250 may map determined level_ID and run syntax elements to a code number cn using a first technique (e.g., a first mathematical relationship) or a second technique (a second mathematical relationship) based a value of the determined level_ID syntax element.

According to the example of FIG. 10, video encoder 250 may determine a value of a level_ID syntax element associated with a transform coefficient (1001). As also shown in FIG. 10, video coder 250 may determine a position k associated with the transform coefficient (1002).

Video encoder 250 may map the determined value to a code number cn using a first technique or a second technique, based on a value of the level_ID syntax element. For example, as depicted in FIG. 10, if the level_ID syntax element has a first value (e.g., level_ID=0), video encoder 250 may access a mapping table $T_k$ of a plurality of mapping tables 1010 stored in memory according to the first technique (e.g., a first mathematical relationship) to determine the code number cn (1003). However, if the determined level_ID syntax element has a second value (e.g., level_ID=1) video encoder 250 may access the mapping table $T_k$ of the plurality of mapping tables 1010 stored in memory according to a second technique (e.g., a second mathematical relationship) different than the first technique to determine the code number cn (1004). According to both the first technique and the second technique, video encoder 250 may select the mapping table $T_k$ from among the plurality of mapping tables 1010 stored in memory based on a determined coefficient position k for the transform coefficient.

As depicted in FIG. 10, mapping tables 1010 may each define a relationship between the run syntax element and the code number cn. For example, as shown in FIG. 10, mapping tables 1010 are configured to receive the run syntax element as an input, and output a code number cn as an output. According to the mapping technique described in FIG. 10, video encoder 250 may map between level_ID and run syntax elements for a transform coefficient, while reducing an size of mapping tables 1010 stored in memory in comparison to other techniques, such as using a mapping table of the plurality of mapping tables 510 that each define a relationship between both of the run and level_ID values and the code number cn, as depicted in FIG. 5.

As also depicted in FIG. 10, video encoder 250 may determine a code number cn. Video encoder 250 may use the determined code number cn to determine a VLC code word (e.g., based on a VLC table of a plurality of VLC tables 262 stored in memory). The encoder may output the VLC codeword. For example, the encoder may output the code number cn to a decoder as part of an entropy encoded bit stream.

Example 3 below depicts one example of pseudo code that may be executed by video encoder 250 consistent with the techniques depicted in FIG. 10. The pseudo code depicted in Example 3 may be stored in memory (e.g., memory 245) of video encoder 250 so that the encoder is able to perform the techniques illustrated in FIG. 10 when needed.

Example 3

```
If (level_ID == 0) {
    cn = T_k(run);
}
else {
    cn = k+T_k( run )+1;
}
```

According to the pseudo code of Example 3, the function $T_k$ indicates a mapping table of a plurality of mapping tables stored in memory. According to this example, video encoder 250 may select the mapping table $T_k$ based on a determined coefficient position k. As depicted in Example 3, video encoder 250 may access a selected mapping table $T_k$ differently dependent on a value of a level_ID syntax element. For example, as shown in Example 3 above, if video encoder 250 determines that level_ID has a value equal to zero, video encoder 250 may determine a code number cn based on accessing a mapping table $T_k$ according to a first technique (e.g., T(run)). According to this example, the coder may input to the mapping table (T) a determined run value to determine a code number cn. As also shown in Example 3 above, if video encoder 250 determines that level_ID does not have a value equal to zero (e.g., level_ID is equal to one) video encoder 250 may access the mapping table $T_k$ based on a second technique (e.g., code number cn equals position k plus mapping table T(run), plus one) different than the first technique, to determine the code number cn.

According to the pseudo code of Example 3, mapping table $T_k$ defines a relationship between the run syntax element and the code number cn. In this manner, mapping table $T_k$ is different than a mapping table of the plurality of mapping tables 510 depicted in FIG. 5, which each define a relationship between both of the run and level_ID syntax elements and the code number cn. Because mapping table $T_k$ only defines a relationship between the run syntax element and the code number cn, mapping table 1010 may consume less memory than mapping tables 510 depicted in FIG. 5.

In some examples, once video encoder 250 has determined the code number cn using one of the first or second mathematical relationships described above, video encoder 250 may determine a VLC codeword that represents the code number cn. For example, video encoder 250 may use the code number cn to access a VLC table of a plurality of VLC tables stored in memory to determine the VLC codeword. The encoder may output the determine VLC codeword to a decoder (e.g., video decoder 350 depicted in FIG. 3), which may then use the VLC codeword to decode a block of video data.

FIG. 11 is a conceptual diagram that illustrates one example of mapping between a code number cn and level_ID and run syntax elements to decode at least one transform coefficient of a block of video data consistent with one or more aspects of this disclosure. The technique depicted in FIG. 11 may be performed by a video decoder 350 (e.g., VLC decoding module 370 depicted in FIG. 3). According to the example of FIG. 11, video decoder 350 may determine a code number cn (1101). For example, video decoder 350 may receive, from an encoder (e.g., video encoder 250 depicted in FIG. 2) a VLC codeword. Video decoder 350 may determine the code number cn based on accessing a VLC table of a plurality of VLC tables stored in memory (e.g., memory 345 depicted in FIG. 3). Video decoder 350 may also determine a position k of a current transform coefficient (1102).

Depending on a value of the code number cn, video decoder 350 may use a first technique or a second technique to determine the level_ID and run syntax elements based on a value of the code number cn. For example, as shown in FIG. 11, if the code number cn has a first value (e.g., less than position k plus 2), then video decoder 350 may assign the level_ID syntax element a value of zero (1103). Video decoder 350 may also select a mapping table of a plurality of mapping tables stored in memory (e.g., based on a determined position k of the transform coefficient). If the code number cn has the first value, video decoder 350 may access the selected mapping table using a first mathematical relationship (1104).

As also shown in FIG. 11, if the code number cn has a second value different than the first value (e.g., greater than or equal to the position k plus 2), video decoder 350 may assign the level_ID syntax element a value of one (1105). As also shown in FIG. 11, if the code number cn has the second value, video decoder 350 may access the selected mapping table using a second mathematical relationship different than the first mathematical relationship (1106).

As shown in FIG. 11, mapping tables 1110 may each define a relationship between the code number cn and the run value. For example, as shown in FIG. 11, mapping tables 1110 each receive as input a code number cn, and output the run syntax element. In this manner, mapping tables 1110 are different than mapping tables 610 depicted in FIG. 6, which define a relationship between the code number cn and both of the level_ID and run syntax elements. In some examples, because mapping tables 1110 only define a relationship between the code number cn and the run syntax element, mapping tables 1110 may consume less memory than mapping tables 610 depicted in FIG. 6.

Based on one of the first or second techniques described above, video decoder 350 may determine a value of the run syntax element and a value of the level_ID syntax element. Video decoder 350 may use the determined level_ID value and the determined run value to decode the block of video data.

Example 4 below is one example of pseudo code that may be executed by video decoder 350 (e.g., VLC decoding module 370 depicted in FIG. 3) consistent with the method depicted in FIG. 11. The pseudo code depicted in Example 4 may be stored in memory (e.g., memory 345) of video decoder 350 so that video decoder 350 is able to perform the techniques illustrated in FIG. 11 when needed.

Example 4

```
if (cn < k+2){
    level_ID = 0;
    run = T⁻¹(cn);
}
else {
    level_ID = 1;
    run = T⁻¹(cn - k - 1);
}
```

According to the pseudo code of Example 4, the functions $T'_k$ indicates a mapping table of a plurality of mapping tables (e.g., mapping tables 1110 depicted in FIG. 11) stored in memory. The function $T'_k$ of Example 4 may indicate an inverse mapping table to mapping table $T_k$ described above with respect to Example 3. According to the pseudo code of Example 4, video decoder 350 may select a mapping table $T'_k$ based on a position k of a current transform coefficient.

According to the techniques of Example 4, video decoder 350 may access mapping table $T'_k$ (e.g., mapping table 1110 depicted in FIG. 10) differently dependent on a value of a code number cn. For example, as shown in Example 4, if video decoder 350 determines that the code number cn has a value less than position k plus two, then video decoder 350 may assign the level_ID syntax element a value of zero. Video decoder 350 may also determine a value for the run syntax element. For example, if the code number cn has a value less than position k plus two, video decoder 350 may determine the run syntax element by accessing mapping table $T'_k$ using a first mathematical relationship (e.g., by applying the code number cn to the mapping table $T'_k$, $T'_k$ (cn).

Otherwise, if video decoder 350 determines that the code number cn has a value greater than or equal to the position k plus two, video decoder 350 may assign level_ID a value of one. Video decoder 350 may also determine a value for the run syntax element. For example, if the code number cn has a value greater than or equal to the position k plus two, video decoder 350 may determine the run syntax element based on accessing mapping table $T'_k$ using a second mathematical relationship (e.g., by applying a value of the code number cn minus position k minus one to the mapping table $T'_k$, $T'_k$ (cn−k−1)). In some examples, once video decoder 350 has determined the level_ID and run syntax elements using the pseudo code of Example 4, video decoder 350 may use the determined level_ID and run syntax elements to code the block of video data.

According to the pseudo code of Example 4, mapping table $T'_k$ defines a relationship between the code number cn and the run syntax element. In this manner, mapping table $T'_k$ is different than a mapping table of the plurality of mapping tables 610 depicted in FIG. 6, which each define a relationship between both of the run and level_ID syntax elements and the code number cn. Because mapping table $T'_k$ only defines a relationship between the code number cn and the run syntax element, mapping tables 1110 depicted in FIG. 11 may consume less memory than one of mapping tables 610 depicted in FIG. 6

Figure 12:
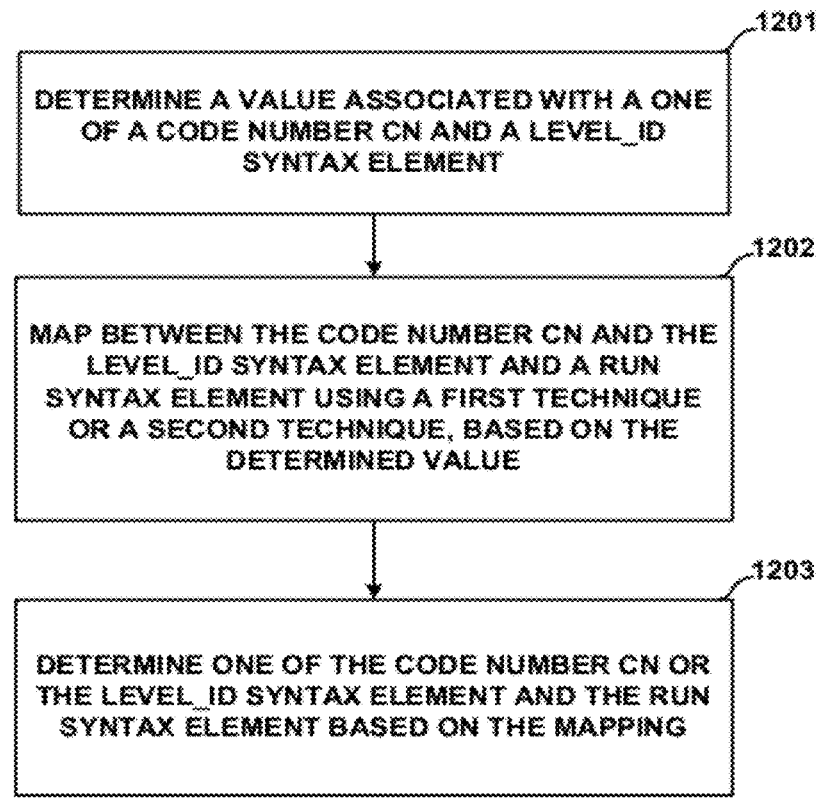
FIG. 12 is a flow diagram that illustrates one example of a method for coding a block of video data consistent with the techniques of this disclosure.

FIG. 12 is a flow diagram that illustrates one example of a method for coding a block of video data consistent with the techniques of this disclosure. As depicted in FIG. 12, a coder (e.g., video encoder 250, video decoder 350) determines a value of one of a code number cn and a level_ID syntax element associated with a transform coefficient of a block of video data (1201). For example, where the technique of FIG. 12 is executed by an encoder (e.g., video encoder 250), the encoder may determine a value of a level_ID syntax element associated with a transform coefficient. The level_ID syntax element may indicate whether a magnitude of a transform coefficient is greater than or equal to one. According to another example, where the technique of FIG. 12 is executed by a decoder (e.g., video decoder 350), the decoder may determine a value of the code number cn based on a received VLC code word. For example, the decoder may access a VLC table of a plurality of VLC tables stored in memory to determine the value of the code number cn based on a received VLC codeword.

As also depicted in FIG. 12, the coder may map between the code number cn and the level_ID syntax element and a run syntax element using a first technique or a second technique, based on the determined value (1202). In some examples, the first technique and the second technique include accessing a mapping table of a plurality of mapping tables stored in memory, selected based on a position k for a current transform coefficient. For example, the coder may, if the determine value is a first value, use the first technique which includes accessing the selected mapping table using a first mathematical relationship. However, if the determined value is a second value different than the first value, the coder may use a second technique different than the first technique, which may include accessing the selected mapping table using a second mathematical relationship different than the first mathematical relationship.

As also depicted in FIG. 12, the coder may determine one of the code number cn or the level_ID syntax element and the run syntax element based on the mapping (1203). For example, where the coder is an encoder, the encoder may map between the code number cn and the level_ID syntax element and the run syntax element to determine the code number cn. According to another example, where the coder is a decoder, the decoder may map between the code number cn and the level_ID syntax element and the run syntax element to determine a value of one or more of the level_ID syntax element and the run syntax element.

The techniques described above with respect to FIGS. 10-12 may be advantageous, because using a mapping table of a plurality of mapping tables stored in memory that each define a relationship between the run syntax element and the code number cn may consume less memory than a plurality of mapping tables 510, 610 each that each define a relationship between the code number cn and both of the level_ID and run syntax elements, as described above with respect to FIGS. 5 and 6.

As described above, the techniques described with respect to FIGS. 10-12 and Examples 3 and 4 may be used independently. For example, a coder may map between a code number cn and level_ID and run syntax elements based on a value of the code number cn or the level_ID syntax element for each coefficient of a block. According to other examples, the coder may map according to the techniques described with respect to FIGS. 10-12 for a first number of coefficients of a block, and map using another technique for a second number of coefficients of a block. According to one example, such a second technique may include a structured mapping as described above with respect to Examples 1 and 2. According to another example, such a second technique may include using a mapping table of a plurality of mapping tables 510, 610 stored in memory that each define a relationship between the code number cn and both of the level_ID and run syntax elements, as described above with respect to FIGS. 5 and 6. According to still another example, a coder may be configured to use each of the three techniques described herein, for different coefficients of a block of video data.

As described above, a coder may be configured to transition between the different techniques for mapping between a code number cn and level_ID and run value for a transform coefficient. According to these examples, the coder may transition between the different mappings described herein based on comparison of a position k to one or more thresholds. Also according to these examples, the different techniques described above may be applied to coefficients of a block of video data differently depending on one or more desired characteristics of coding. For example, such one or more thresholds may be adjusted dependent on a desired accuracy, efficiency, and/or memory usage of a coder to decode a block of video data, thereby providing greater flexibility in video coding.

Example 5 below depicts one example of pseudo code that may be used by an encoder (e.g., video encoder 250 depicted in FIG. 2) to transition between the mapping technique described with respect to FIGS. 10 and 12, and the structured mapping described with respect to Example 1 above, to encode different coefficients of a block of video data. The pseudo code depicted in Example 5 may be stored in memory (e.g., memory 245) of the encoder so that the encoder is able to perform these techniques when needed.

Example 5

```
if k<T {
    if (level_ID == 0) {
        cn = T(run);
    }
    else {
        cn = k+T( run ) + 1;
    }
}
else if k>=T {
    if (level_ID == 0) {
        cn = run;
    else {
        cn = k + run + 2;
    }
}
```

As depicted by the pseudo code of Example 5, video encoder 250 may, based on comparison of a coefficient position k to a threshold T, apply one of the structured mapping described above with respect to Example 1, or the techniques described above with respect to FIGS. 10 and 12. For example, as shown by Example 5, if a position k of a current coefficient is less than the threshold T, then the coder may access a mapping table of a plurality of mapping tables 1010 stored in memory according to a first technique or a second technique based on a value of level_ID. For example, if level_ID has a value of zero, according to the first technique the encoder may input a value of run into a selected mapping table $T_k$ to determine a code number cn. However, if level_ID does not have a value of zero (e.g., level_ID has a value of one), according to the second technique, video encoder 250 may assign the code number cn a value of position k plus $T_k$ (run) plus one.

As also depicted in Example 5, if the position k of a transform coefficient is greater than or equal to the threshold T, the encoder may determine the code number cn based on a structured mapping as described above with respect to Example 1. For example, if the value of level_ID is equal to zero, the encoder may assign the code number cn a determined value of run. However, if the value of level_ID is not equal to zero (e.g., equal to one), then the encoder may assign the code number cn the value of position k, plus the value of run, plus two.

Example 6 below depicts one example of pseudo code that may be used by a decoder (e.g., video decoder 350 depicted in FIG. 3) to transition between the mapping technique described with respect to FIGS. 11 and 12, and the structured mapping described with respect to Example 2 above, for different transform coefficients of a block of video data. The pseudo code depicted in Example 6 may be stored in memory (e.g., memory 345) of the decoder so that the decoder is able to perform these techniques when needed.

Example 6

```
if k < T {
    if (cn < k +2) {
        level_ID = 0;
        run = T-¹ (cn);
    }
    else {
        level_ID = 1;
        run = T-¹ (cn-k-1);
    }
}
else {
    if (cn < k + 2) {
        level_ID = 0;
        run = cn;
    {
    else {
        level_ID = 1;
        run = cn - k - 2;
    }
}
```

As depicted by the pseudo code of Example 6, video decoder 350 may, based on comparison of a coefficient position k to a threshold T, apply one of the structured mapping described above with respect to Example 2, or the techniques described above with respect to FIGS. 11-12. For example, as shown by Example 6, if a position k of a current coefficient is less than the threshold T, then the coder may access a mapping table plurality of mapping tables 1110 of a stored in memory according to a first technique or a second technique based on a value of a code number cn. For example, if the code number cn has a value less than position k plus 2, video decoder 350 may assign a value of zero to level_ID. If the code number cn has a value less than position k plus 2, video decoder 350 may access a mapping table $T'_k$ stored in memory according to a first mathematical relationship (e.g., input the code number cn into the mapping table $T'_k$ to determine a value of run, $T'_k$ (cn)). However, if the code number cn is greater than or equal to position k plus 2, the decoder may assign level_ID a value of 1. If the code number cn is greater than or equal to position k plus 2, video decoder 350 may also access the mapping table $T'_k$ stored in memory according to a second mathematical relationship, (e.g., input the code number cn minus the position k minus 1 into the mapping table $T'_k$ (e.g., T'(cn–k–1)) to determine a value of the run syntax element.

As also depicted in Example 6, if the position k of a transform coefficient is greater than or equal to the threshold T, video decoder 350 may determine the at least one syntax element (e.g., the level_ID syntax element and/or the run syntax element) based on a structured mapping as described above with respect to Example 2. For example, if the value of code number cn is less than position k plus two, video decoder 350 may assign level_ID a value of zero, and run a value of the code number cn. However, if the value of code number cn is greater than or equal to the position k plus two, video decoder 350 may assign level_ID a value of one, and run a value of the code number cn, minus the position k, minus two.

In one or more examples, the functions described herein may be implemented at least partially in hardware, such as specific hardware components or a processor. More generally, the techniques may be implemented in hardware, processors, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium, i.e., a computer-readable transmission medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples been described. These and other examples are within the scope of the following claims.

The invention claimed is:

1. A method for decoding a block of video data, comprising:
    storing, in memory, a mapping table that maps entries to codeword numbers, each respective entry of the entries mapping a respective level identifier and run value pair for a respective coefficient position of the block of the video data below a threshold, wherein the block of video data includes coefficient positions greater than the threshold;
    in response to determining a first coefficient of the block is at a coefficient position greater than the threshold, using a first technique to map from a first code number cn for a first transform coefficient to a first run value for the first transform coefficient, wherein the first technique comprises determining the first run value for the first transform coefficient as a function of the first code number without using the mapping table, wherein the first run value for the first transform coefficient indicates a number of zero value coefficients between the first transform coefficient and a next non-zero coefficient after the first transform coefficient;
    in response to determining a second coefficient of the block is at a coefficient position less than the threshold, using a second technique different from the first technique to map from a second code number cn for a second transform coefficient to a second run value for the second transform coefficient, wherein the second technique comprises using the respective code word for the respective transform coefficient to identify an entry in the mapping table indicating the second run value for the second transform coefficient, wherein the second run value for the second transform coefficient indicates a number of zero value coefficients between the second transform coefficient and a next non-zero coefficient after the second transform coefficient; and
    using the first run value for the first transform coefficient and the second run value for the second transform coefficient to decode the block of video data.

2. The method of claim 1, wherein using the second technique further comprises:
    selecting the mapping table from a plurality of mapping tables stored in the memory based on a position k of the second transform coefficient of the block.

3. The method of claim 2, wherein the plurality of mapping tables comprise less mapping tables than a number of potential coefficient positions of the block.

4. The method of claim 1, wherein the first run value associated with the first transform coefficient and the second run value associated with the second transform coefficient each are further associated with a respective levelID value, wherein the respective levelID value indicates whether an absolute value of the respective next non-zero coefficient is equal to 1 or greater than 1.

5. The method of claim 1, further comprising:
    determining a first variable length coding (VLC) code word that represents the first code number cn for the first transform coefficient;
    using a first VLC table stored in memory to determine the first code number cn based on the first VLC code word;
    determining a second VLC code word that represents the second code number cn for the second transform coefficient; and
    using a second VLC table stored in memory to determine the second code number cn based on the second VLC code word.

6. A device for decoding a block of video data, the device comprising:
    a memory configured to store the video data; and
    a variable length coding (VLC) decoding module configured to cause one or more processors to:
        store, in memory, a mapping table that maps entries to codeword numbers, each respective entry of the entries mapping a respective level identifier and run value pair for a respective coefficient position of the block of the video data below a threshold, wherein the block of video data includes coefficient positions greater than the threshold;
        in response to determining a first coefficient of the block is at a coefficient position greater than the threshold, use a first technique to map from a first code number cn for a first transform coefficient to a first run value for the first transform coefficient, wherein the first technique comprises determining the first run value for the first transform coefficient as a function of the first code number without using the mapping table, wherein the first run value for the first transform coefficient indicates a number of zero value coefficients between the first transform coefficient and a next non-zero coefficient after the first transform coefficient;
        in response to determining a second coefficient of the block is at a coefficient position less than the threshold, use a second technique different from the first technique to map from a second code number cn for a second transform coefficient to a second run value the second transform coefficient, wherein the second technique comprises using the respective code word for the respective transform coefficient to identify an entry in the mapping table indicating the second run value for the second transform coefficient, wherein the second run value for the second transform coefficient indicates a number of zero value coefficients between the second transform coefficient and a next non-zero coefficient after the second transform coefficient; and use the first run value for the first transform coefficient and the second run value for the second transform coefficient to decode the block of video data.

7. A device for decoding a block of video data, comprising:

means for storing, in memory, a mapping table that maps entries to codeword numbers, each respective entry of the entries mapping a respective level identifier and run value pair for a respective coefficient position of the block of the video data below a threshold, wherein the block of video data includes coefficient positions greater than the threshold;

means for using a first technique to map from a first code number cn for a first transform coefficient to a first run value for the first transform coefficient in response to determining a first coefficient of the block is at a coefficient position greater than the threshold, wherein the first technique comprises determining the first run value for the first transform coefficient as a function of the first code number without using the mapping table, wherein the first run value for the first transform coefficient indicates a number of zero value coefficients between the first transform coefficient and a next non-zero coefficient after the first transform coefficient;

means for using a second technique different from the first technique to map from a second code number cn for a second transform coefficient to a second run value the second transform coefficient in response to determining a second coefficient of the block is at a coefficient position less than the threshold, wherein the second technique comprises using the respective code word for the respective transform coefficient to identify an entry in the mapping table indicating the second run value for the second transform coefficient, wherein the second run value for the second transform coefficient indicates a number of zero value coefficients between the second transform coefficient and a next non-zero coefficient after the second transform coefficient; and means for using the first run value for the first transform coefficient and the second run value for the second transform coefficient to decode the block of video data.

8. A non-transitory computer-readable storage medium that stores instructions configured to cause a computing device to:

store, in memory, a mapping table that maps entries to codeword numbers, each respective entry of the entries mapping a respective level identifier and run value pair for a respective coefficient position of the block of the video data below a threshold, wherein the block of video data includes coefficient positions greater than the threshold;

in response to determining a first coefficient of the block is at a coefficient position greater than the threshold, use a first technique to map from a first code number cn for a first transform coefficient to a first run value for the first transform coefficient, wherein the first technique comprises determining the first run value for the first transform coefficient as a function of the first code number without using the mapping table, wherein the first run value for the first transform coefficient indicates a number of zero value coefficients between the first transform coefficient and a next non-zero coefficient after the first transform coefficient;

in response to determining a second coefficient of the block is at a coefficient position less than the threshold, use a second technique different from the first technique to map from a second code number cn for a second transform coefficient to a second run value the second transform coefficient, wherein the second technique comprises using the respective code word for the respective transform coefficient to identify an entry in the mapping table indicating the second run value for the second transform coefficient, wherein the second run value for the second transform coefficient indicates a number of zero value coefficients between the second transform coefficient and a next non-zero coefficient after the second transform coefficient; and use the first run value for the first transform coefficient and the second run value for the second transform coefficient to decode the block of video data.

9. A method for encoding a block of video data, comprising:

storing, in memory, a mapping table that maps entries to codeword numbers, each respective entry of the entries mapping a respective level identifier and run value pair for a respective coefficient position of the block of the video data below a threshold, wherein the block of video data includes coefficient positions greater than the threshold;

in response to determining a first coefficient of the block is at a coefficient position greater than the threshold, using a first technique to map from a first run value associated with the first transform coefficient to a first code number cn for the first transform coefficient, wherein the first technique comprises determining the first code number cn as a function of the first run value, wherein the first run value associated with the first transform coefficient indicates a number of zero value coefficients between the first transform coefficient and a next non-zero coefficient after the first transform coefficient;

in response to determining a second coefficient of the block is at a coefficient position less than the threshold, using a second technique different from the first technique to map from a second run value associated with a second transform coefficient to a second code number cn for the second transform coefficient of the block of video data, wherein the second technique comprises using the respective run value for the respective transform coefficient to identify an entry in the mapping table stored in memory indicating the second code number cn for the second transform coefficient, wherein the second run value associated with the second transform coefficient indicates a number of zero value coefficients between the second transform coefficient and a next non-zero coefficient after the second transform coefficient;

using the first code number cn to determine a first variable length coding (VLC) codeword;

using the second code number cn to determine a second VLC codeword; and outputting the first VLC codeword and the second VLC codeword.

10. The method of claim 9, wherein using the second technique further comprises:

selecting the mapping table from a plurality of mapping tables stored in the memory based on a position k of the second transform coefficient of the block.

11. The method of claim 10, wherein the plurality of mapping tables comprise less mapping tables than a number of potential coefficient positions of the block.

12. The method of claim 9, wherein the first run value associated with the first transform coefficient and the second run value associated with the second transform coefficient each are further associated with a respective levelID value, wherein the respective levelID value indicates whether an absolute value of the respective next non-zero coefficient is equal to 1 or greater than 1.

13. A device for encoding a block of video data, the device comprising:
  a memory configured to store the video data; and
  a VLC encoding module configured to cause one or more processors to:
    store, in memory, a mapping table that maps entries to codeword numbers, each respective entry of the entries mapping a respective level identifier and run value pair for a respective coefficient position of the block of the video data below a threshold, wherein the block of video data includes coefficient positions greater than the threshold;
    in response to determining a first coefficient of the block is at a coefficient position greater than the threshold, use a first technique to map from a first run value associated with the first transform coefficient to a first code number cn for the first transform coefficient, wherein the first technique comprises determining the first code number cn as a function of the first run value, wherein the first run value associated with the first transform coefficient indicates a number of zero value coefficients between the first transform coefficient and a next non-zero coefficient after the first transform coefficient;
    in response to determining a second coefficient of the block is at a coefficient position less than the threshold, use a second technique different from the first technique to map from a second run value associated with a second transform coefficient to a second code number cn for the second transform coefficient of the block of video data, wherein the second technique comprises using the respective run value for the respective transform coefficient to identify an entry in the mapping table stored in memory indicating the second code number cn for the second transform coefficient, wherein the second run value associated with the second transform coefficient indicates a number of zero value coefficients between the second transform coefficient and a next non-zero coefficient after the second transform coefficient;
    use the first code number cn to determine a first variable length coding (VLC) codeword;
    use the second code number cn to determine a second VLC codeword; and
    output the first VLC codeword and the second VLC codeword.

14. A device for encoding a block of video data, the device comprising:
  means for storing, in memory, a mapping table that maps entries to codeword numbers, each respective entry of the entries mapping a respective level identifier and run value pair for a respective coefficient position of the block of the video data below a threshold, wherein the block of video data includes coefficient positions greater than the threshold;
  means for using a first technique to map from a first run value associated with the first transform coefficient to a first code number cn for the first transform coefficient in response to determining a first coefficient of the block is at a coefficient position greater than the threshold, wherein the first technique comprises determining the first code number cn as a function of the first run value, wherein the first run value associated with the first transform coefficient indicates a number of zero value coefficients between the first transform coefficient and a next non-zero coefficient after the first transform coefficient;
  means for using a second technique different from the first technique to map from a second run value associated with a second transform coefficient to a second code number cn for the second transform coefficient of the block of video data in response to determining a second coefficient of the block is at a coefficient position less than the threshold, wherein the second technique comprises using the respective run value for the respective transform coefficient to identify an entry in the mapping table stored in memory indicating the second code number cn for the second transform coefficient, wherein the second run value associated with the second transform coefficient indicates a number of zero value coefficients between the second transform coefficient and a next non-zero coefficient after the second transform coefficient;
  means for using the first code number cn to determine a first VLC codeword;
  means for using the second code number cn to determine a second VLC codeword; and
  means for outputting the first VLC codeword and the second VLC codeword.

15. A non-transitory computer-readable storage medium that stores instructions configured to cause a computing device to:
  store, in memory, a mapping table that maps entries to codeword numbers, each respective entry of the entries mapping a respective level identifier and run value pair for a respective coefficient position of the block of the video data below a threshold, wherein the block of video data includes coefficient positions greater than the threshold;
  in response to determining a first coefficient of the block is at a coefficient position greater than the threshold, use a first technique to map from a first run value associated with the first transform coefficient to a first code number cn for the first transform coefficient, wherein the first technique comprises determining the first code number cn as a function of the first run value, wherein the first run value associated with the first transform coefficient indicates a number of zero value coefficients between the first transform coefficient and a next non-zero coefficient after the first transform coefficient;
  in response to determining a second coefficient of the block is at a coefficient position less than the threshold, use a second technique different from the first technique to map from a second run value associated with a second transform coefficient to a second code number cn for the second transform coefficient of the block of video data, wherein the second technique comprises using the respective run value for the respective transform coefficient to identify an entry in the mapping table stored in memory indicating the second code number cn for the second transform coefficient, wherein the second run value associated with the second transform coefficient indicates a number of zero value coefficients between the second transform coefficient and a next non-zero coefficient after the second transform coefficient;

use the first code number cn to determine a first variable length coding (VLC) codeword;

use the second code number cn to determine a second VLC codeword; and output the first VLC codeword and the second VLC codeword.

16. The method of claim 1, wherein the function of the first code number comprises a linear function of the first code number, a position of the first transform coefficient, and a levelID value, wherein the levelID value indicates whether an absolute value of the next non-zero coefficient after the first transform coefficient is equal to 1 or greater than 1.

17. The device of claim 6, wherein the function of the first code number comprises a linear function of the first code number, a position of the first transform coefficient, and a levelID value, wherein the levelID value indicates whether an absolute value of the next non-zero coefficient after the first transform coefficient is equal to 1 or greater than 1.

18. The device of claim 6, wherein the device comprises at least one of:
an integrated circuit;
a microprocessor; or
a wireless communication device.

19. The device of claim 6, further comprising a display configured to display the decoded video data.

20. The device of claim 7, wherein the function of the first code number comprises a linear function of the first code number, a position of the first transform coefficient, and a levelID value, wherein the levelID value indicates whether an absolute value of the next non-zero coefficient after the first transform coefficient is equal to 1 or greater than 1.

21. The non-transitory computer-readable storage medium of claim 8, wherein the function of the first code number comprises a linear function of the first code number, a position of the first transform coefficient, and a levelID value, wherein the levelID value indicates whether an absolute value of the next non-zero coefficient after the first transform coefficient is equal to 1 or greater than 1.

22. The method of claim 9, wherein the function of the first code number comprises a linear function of the first code number, a position of the first transform coefficient, and a levelID value, wherein the levelID value indicates whether an absolute value of the next non-zero coefficient after the first transform coefficient is equal to 1 or greater than 1.

23. The device of claim 13, wherein the function of the first code number comprises a linear function of the first code number, a position of the first transform coefficient, and a levelID value, wherein the levelID value indicates whether an absolute value of the next non-zero coefficient after the first transform coefficient is equal to 1 or greater than 1.

24. The device of claim 13, wherein the device comprises at least one of:
an integrated circuit;
a microprocessor; or
a wireless communication device.

25. The device of claim 13, further comprising a display configured to display the decoded video data.

26. The device of claim 14, wherein the function of the first code number comprises a linear function of the first code number, a position of the first transform coefficient, and a levelID value, wherein the levelID value indicates whether an absolute value of the next non-zero coefficient after the first transform coefficient is equal to 1 or greater than 1.

27. The non-transitory computer-readable storage medium of claim 15, wherein the function of the first code number comprises a linear function of the first code number, a position of the first transform coefficient, and a levelID value, wherein the levelID value indicates whether an absolute value of the next non-zero coefficient after the first transform coefficient is equal to 1 or greater than 1.

* * * * *